United States Patent

Komano et al.

[11] Patent Number: 6,010,824
[45] Date of Patent: Jan. 4, 2000

[54] PHOTOSENSITIVE RESIN COMPOSITION CONTAINING A TRIAZINE COMPOUND AND A PRE-SENSITIZED PLATE USING THE SAME, AND PHOTOSENSITIVE RESIN COMPOSITION CONTAINING ACRIDINE AND TRIAZINE COMPOUNDS AND A COLOR FILTER AND A PRE-SENSITIZED PLATE USING THE SAME

[75] Inventors: Hiroshi Komano; Takeshi Iwai; Katsuyuki Ohta; Toshimi Aoyama; Kiyoshi Uchikawa, all of Kanagawa, Japan

[73] Assignee: Tokyo Ohka Kogyo Co., Ltd., Kanagawa, Japan

[21] Appl. No.: 08/889,566

[22] Filed: Jul. 8, 1997

Related U.S. Application Data

[63] Continuation-in-part of application No. 08/634,580, Apr. 18, 1996, abandoned, and application No. 08/477,256, Jun. 7, 1995, abandoned, which is a division of application No. 08/453,997, May 30, 1995, abandoned, which is a continuation of application No. 08/149,798, Nov. 10, 1993, abandoned, said application No. 08/634,580, is a division of application No. 08/359,640, Dec. 20, 1994, abandoned.

[30] Foreign Application Priority Data

| Nov. 10, 1992 | [JP] | Japan | 4-324799 |
| Apr. 2, 1993 | [JP] | Japan | 5-77037 |
| Dec. 29, 1993 | [JP] | Japan | 5-353690 |

[51] Int. Cl.$^7$ .................................................. G03C 1/725
[52] U.S. Cl. ............................. 430/281.1; 430/288.1; 430/915; 430/920; 430/925; 522/26; 522/63
[58] Field of Search ........................ 430/281.1, 288.1, 430/915, 920, 925; 522/26, 63

[56] References Cited

U.S. PATENT DOCUMENTS

| 3,181,461 | 5/1965 | Fromson | 101/149.2 |
| 3,779,778 | 12/1973 | Smith et al. | 430/270 |
| 3,834,998 | 9/1974 | Watanabe et al. | 204/33 |
| 3,891,516 | 6/1975 | Chu | 204/33 |

(List continued on next page.)

FOREIGN PATENT DOCUMENTS

| 2050947 | 3/1992 | Canada | 430/271 |
| 0313007 | 4/1989 | European Pat. Off. | G03C 1/68 |
| 0379200 | 7/1990 | European Pat. Off. | G03F 7/31 |
| 0503674 | 9/1992 | European Pat. Off. | G03F 7/29 |

(List continued on next page.)

*Primary Examiner*—Nam Nguyen
*Assistant Examiner*—Steven H. Ver Steeg
*Attorney, Agent, or Firm*—Sughrue, Mion, Zinn, Macpeak & Seas, PLLC

[57] ABSTRACT

A photosensitive resin composition comprising a polymeric binder, an ethylenically unsaturated monomer and a photopolymerization initiator is disclosed. Also, a PS plate using the same is disclosed. The photopolymerization initiator comprises at least one compound selected from specific triazine compounds having a bromine atom on the substituted phenyl nucleus thereof and specific trihalomethyl-containing triazine compounds. The composition has high photosensitivity sufficient for exposure with an argon laser light and satisfactory developability. Additionally disclosed is a photosensitive resin composition comprising a polymeric binder, a monomer having an ethylenically unsaturated double bond and photopolymerization initiators including an acridine compound and a specific triazine compound. This second photosensitive resin composition has high sensitivity, high resolution and a wide development margin. Using this photosensitive resin composition, color filters and PS plates can be produced that have high sensitivity and resolution even to low-energy visible light and which assure high pattern reproducibility.

24 Claims, 2 Drawing Sheets

U.S. PATENT DOCUMENTS

| | | | |
|---|---|---|---|
| 4,239,850 | 12/1980 | Kita et al. | 430/281 |
| 4,258,123 | 3/1981 | Nagashima et al. | 430/281 |
| 4,272,610 | 6/1981 | Breslow et al. | 430/281 |
| 4,505,793 | 3/1985 | Tamoto et al. | 430/281 |
| 4,521,503 | 6/1985 | Herbert | 430/49 |
| 4,578,342 | 3/1986 | Sekiya | 430/159 |
| 4,774,163 | 9/1988 | Higashi | 430/281 |
| 4,801,527 | 1/1989 | Takamiya et al. | 430/166 |
| 4,810,618 | 3/1989 | Koike et al. | 430/281 |
| 4,820,607 | 4/1989 | Toshiaki | 430/190 |
| 4,826,753 | 5/1989 | Higashi et al. | 430/281 |
| 4,845,011 | 7/1989 | Wilczak et al. | 430/281.1 |
| 4,983,498 | 1/1991 | Rode et al. | 430/284 |
| 4,985,341 | 1/1991 | Rode et al. | 430/287 |
| 4,987,055 | 1/1991 | Rode et al. | 430/277 |
| 5,043,249 | 8/1991 | Rode et al. | 430/271 |
| 5,049,479 | 9/1991 | Zertani et al. | 430/271 |
| 5,066,564 | 11/1991 | Zertani et al. | 430/284 |
| 5,068,371 | 11/1991 | Steiner et al. | 556/53 |
| 5,085,974 | 2/1992 | Frass et al. | 430/284 |
| 5,219,709 | 6/1993 | Nagasaka et al. | 430/281.1 |
| 5,229,253 | 7/1993 | Zertani et al. | 430/281 |
| 5,300,399 | 4/1994 | Wilczak | 430/253 |
| 5,332,650 | 7/1994 | Murata et al. | 430/270 |
| 5,336,574 | 8/1994 | Igarashi et al. | 430/288 |

FOREIGN PATENT DOCUMENTS

| | | | |
|---|---|---|---|
| 4338437 | 5/1994 | Germany | 430/271 |
| 50-40047 | 12/1975 | Japan | G03F 7/00 |
| 60-202437 | 10/1985 | Japan | G03C 1/68 |
| 60-239736 | 11/1985 | Japan | G03C 1/00 |
| 62-38451 | 2/1987 | Japan | G03C 1/72 |
| 63-70243 | 3/1988 | Japan | G03C 1/68 |
| 3239703 | 10/1991 | Japan | G08F 2/50 |
| 1388492 | 3/1975 | United Kingdom | C09B 23/00 |
| 2029428 | 3/1980 | United Kingdom | C08F 2/50 |
| 2195121 | 3/1988 | United Kingdom | C08F 4/00 |
| 2273101 | 6/1994 | United Kingdom | 430/271 |
| 8102262 | 8/1981 | WIPO | B05D 3/00 |

PHOTOSENSITIVE RESIN COMPOSITION CONTAINING A TRIAZINE COMPOUND AND A PRE-SENSITIZED PLATE USING THE SAME, AND PHOTOSENSITIVE RESIN COMPOSITION CONTAINING ACRIDINE AND TRIAZINE COMPOUNDS AND A COLOR FILTER AND A PRE-SENSITIZED PLATE USING THE SAME

CROSS REFERENCE TO RELATED APPLICATIONS

This is a continuation-in-part of application Ser. No. 08/477,256 filed Jun. 7, 1995 now abandoned and application Ser. No. 08/634,580 filed Apr. 18, 1996 now abandoned. Application Ser. No. 08/477,256 is a divisional of application Ser. No. 08/453,997 filed May 30, 1995, now abandoned, which is a continuation of application Ser. No. 08/149,798 filed Nov. 10, 1993, now abandoned. Application Ser. No. 08/634,580 abandoned is a divisional of application Ser. No. 08/359,640 filed Dec. 20, 1994, now abandoned.

FIELD OF THE INVENTION

A first aspect of this invention relates to a photosensitive resin composition having very high sensitivity and excellent developability. More particularly, this aspect of the invention relates to a photosensitive resin composition which cures on exposure to visible light, such as ultraviolet rays and argon laser light, to provide a pattern. The photosensitive resin composition is useful as a resist (e.g., a photoresist, a photosolder resist, a plating resist) for printing plates, such as a letterpress printing plate, an intaglio printing plate and a litho printing plate, or printed circuit boards, as a resist for preparing a color filter or the black matrix of a liquid crystal or plasma display and as a photopolymerizable paste composition. The present invention also relates to a presensitized plate using the photosensitive resin composition.

A second aspect of this invention relates to a photosensitive resin composition which contains both an acridine compound and a specific triazine compound as photopolymerization initiators. This aspect of the invention also relates to a color filter and a pre-sensitized plate using the resin composition.

BACKGROUND OF THE INVENTION

Techniques of applying a photosensitive resin composition comprising a polymeric binder, an ethylenically unsaturated monomer, and a triazine photopolymerization initiator to making printing plates, forming a photoresist, and the like are hitherto known. Triazine photopolymerization initiators are widely employed because of their higher sensitivity to thereby achieve satisfactory image reproducibility, as compared to various other initiators, such as benzophenone initiators, anthraquinone initiators and thioxanthone initiators.

Examples of known photosensitive resin compositions as described above include a photosensitive image-forming composition comprising a 2,4,5-triarylimidazolyl dimer as a photopolymerization initiator and an addition polymerizable ethylenically unsaturated monomer as disclosed in JP-A-60-202437 (the term "JP-A" as used herein means an "unexamined published Japanese patent application"), and a photosensitive composition containing a photosensitive s-triazine compound as disclosed in JP-A-60-239736.

The triazine compounds described in these publications have a disadvantage of poor storage stability and are apt to produce scum during development. In order to overcome this problem, triazine compounds having a specific structure have been proposed as disclosed in JP-A-63-68831 and JP-A-63-70243. In recent years, however, there has been a demand for the development of photosensitive compositions having a higher resolving power and improved developability in the field of printing plates, printed circuit boards, electronic devices, and the like, and even the above-mentioned improved triazine compounds are still unsatisfactory in terms of both resolving power and developability.

With the latest technological development of electronic devices such as computers, factory automation has also advanced in the field of printing, enabling integral processing from the input of an original or image data through plate making, inclusive of editing and proofreading. In such an advanced plate making technique, direct imaging using a laser beam is employed. The laser beam thus used is preferably an argon laser beam having a wavelength of 488 nm in the visible region. Hence, there has been a demand to develop a resin composition having photosensitivity to visible light. Various photosensitive resin compositions meeting this demand have been proposed to date as described, e.g., in JP-A-63-260909, JP-A-1-105238, JP-A-1-203413, JP-A-1-203414, JP-A-2-1714, JP-A-2-73813, JP-A-2-127404, and JP-A-3-239703.

Of these proposals, the compositions described in JP-A-63-260909, JP-A-1-105238, JP-A-1-203413, JP-A-203414, JP-A-2-1714 and JP-A-2-73813 use an acridine compound and a trihalomethyl-containing triazine compound as a photopolymerization initiator, and the compositions of JP-A-2-127404 and JP-A-3-239703 use a metallocene compound in addition to the above-mentioned photopolymerization initiators.

On the other hand, with respect to a presensitized plate (hereinafter abbreviated as a PS plate) suitable for producing a litho printing plate, a known process for producing a PS plate comprises subjecting a surface-grained aluminum plate 1 to anodizing to form oxide layer 2, rendering the oxide layer hydrophilic, and then coating a photosensitive resin composition on the resulting aluminum substrate to form photosensitive resin layer 3 as shown in FIG. 1. If desired, overcoat layer 4 may be provided on the resin layer as an oxygen barrier.

When the above-mentioned PS plate, etc. is exposed to high energy radiation, such as ultraviolet light, a film original must be used, which gives rise to a problem of poor image reproducibility due to the poor image reproduction of the film itself and insufficient contact between the film and the photosensitive resin layer. When a laser beam is used for exposure, image formation is conducted by direct scanning without using a film original and is therefore free from the problem of reproducibility. The problem associated with image formation with a laser beam is that a high-energy short-wavelength laser has a short life for practical use and that a laser having a relatively long wavelength, such as an argon laser, has low energy and demands a highly sensitive photosensitive resin composition. There has therefore been a demand to develop such a highly sensitive photosensitive resin composition.

Returning to the compositions using an acridine compound and a trihalomethyl-containing triazine compound, their sensitivity to argon laser light is insufficient. There are also problems which still remain unresolved in that a long exposure time is required and there is a reduction in image reproducibility due to insufficient curing. The technique using a metallocene compound in combination as disclosed in JP-A-2-127404 also fails to satisfy all the requirements of sensitivity, adhesion, developability and pattern forming precision.

On the other hand, photosensitive resin compositions have been applied, for example, to color filters for liquid crystal display devices and pre-sensitized plates (PS plates) for use in lithography.

An example of a method for producing a color filter is the pigment dispersion method which permits easy processing operations. This pigment dispersion method comprises dispersing a pigment to be incorporated into a photosensitive resin composition, applying the photosensitive resin composition to a substrate, drying, then exposing through a pattern mask and developing to thereby form a relief resin layer having a desired color. A PS plate for use in lithography is typically prepared by surface-graining an aluminum substrate, anodizing the substrate to form an oxide coating film, rendering the surface of the oxide film hydrophilic, and then applying a photosensitive resin composition onto this oxide coating film to thereby form a photosensitive resin layer.

However, conventional photosensitive resin compositions employed in the production of color filters by the pigment dispersion method are insufficient in the sensitivity that can be achieved by exposure through a pattern mask. Hence, exposure time can hardly be shortened and a high-energy light source is required for exposure. Namely, these conventional photosensitive resin compositions fail to meet the demand for saving energy. Conventional photosensitive resin compositions are also disadvantageous in that they have poor resolution and fine-line reproducibility, and thus it is difficult to produce high-quality color filters using such resin compositions. Furthermore, the conventional photosensitive resin compositions have another problem in that they provide for small development margins (e.g., an optimum time range for achieving satisfactory developing process). As a result, even exposed areas will come off the substrate if the processing time exceeds the optimum time no matter how small the excess is.

In the case of a PS plate, a photosensitive resin layer is generally exposed, for example, to high-energy radiation such as UV light through a pattern mask and then developed. However, there have been several problems including poor image production of the pattern mask per se and poor image reproducibility due to insufficient contact between the pattern mask and the photosensitive resin layer. These problems have been solved to a level that is satisfactory for the time being. This is because the recently developed direct drawing method which allows patterns to be directly drawn by a laser beam scanning exposure has made it possible to perform integral processing from input of an original or image data to platemaking, inclusive of editing and proofreading and processing. Thus, pattern masks are no longer required. However, when this direct drawing method is effected using laser beams having a relatively long wavelength and low energy (for example, an argon laser having a wavelength of 488 nm in the visible region), a photosensitive resin composition must be used which not only has high sensitivity to low-energy visible light, but which also assures high resolution. In fact, however, photosensitive resin compositions which possess these characteristics so far have not been discovered.

SUMMARY OF THE INVENTION

An object of the first aspect of the present invention is to provide a photosensitive resin composition which has high resolving power, satisfactory developability and sufficient sensitivity to argon laser light of low energy, and which is useful as a photoresist, a photosolder resist or a plating resist for printing plates, such as a letterpress printing plate, an intaglio printing plate and a litho printing plate, or for printed circuit boards; a resist composition for preparing a color filter or a black matrix of a liquid crystal or plasma display; and a photopolymerizable paste composition.

Another object of the first aspect of the present invention is to provide a PS plate which is sensitive to argon laser light to form a precise image and capable of reducing the number of steps involved for plate making.

In order to accomplish the above objectives, the present inventors have conducted extensive investigations. As a result, they have found that a specific triazine compound having a bromine atom on the substituted phenyl nucleus thereof or a specific trihalomethyl-containing triazine compound is an excellent photopolymerization initiator providing a photosensitive resin composition having high resolving power, satisfactory developability and sufficient sensitivity to argon laser light. The above first aspect of the present invention has been achieved based on this finding.

Thus, the above objects of the first aspect of the present invention are achieved by providing a photosensitive resin composition comprising a polymeric binder, an ethylenically unsaturated monomer and a photopolymerization initiator, wherein the photopolymerization initiator comprises at least one compound selected from triazine compounds represented by formulae (I) to (V):

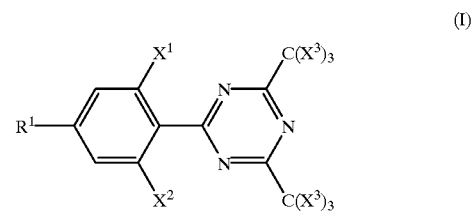

(I)

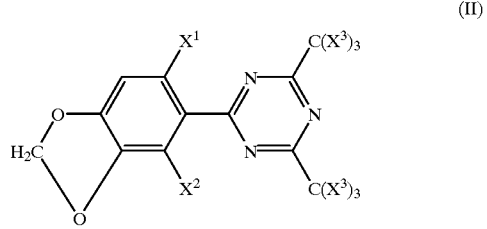

(II)

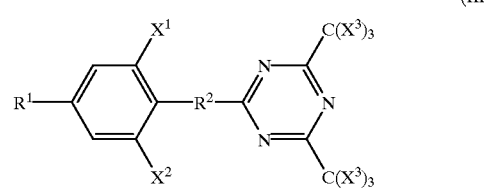

(III)

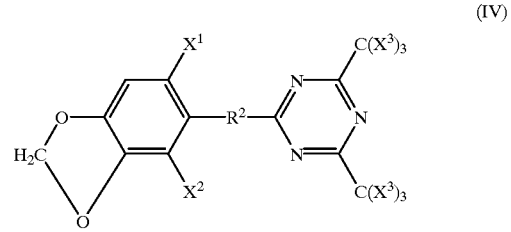

(IV)

-continued

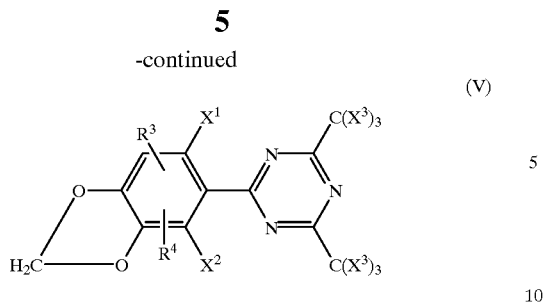

(V)

wherein $X^1$ and $X^2$ each independently represents a hydrogen atom or a bromine atom; $X^3$ represents a chlorine atom or a bromine atom; $R^1$ represents an alkyl group having form 1 to 3 carbon atoms or an alkoxy group having from 1 to 3 carbon atoms; $R^2$ represents a methylene group or a vinylene group; and $R^3$ and $R^4$ each independently represents a hydrogen atom or a methyl group.

In a preferred embodiment, at least one of $X^1$ and $X^2$ is a bromine atom.

It is preferable to use the photopolymerization initiators of formulae (I) to (V) in combination with a titanocene compound and/or an acridine compound.

The above first aspect of the present invention also provides a PS plate comprising an aluminum substrate and a photosensitive resin layer provided on the surface of the aluminum substrate, wherein the surface of the aluminum substrate, prior to providing the photosensitive resin layer thereon, is subjected to mechanical and electrolytic graining, anodizing and rendering the surface thereof hydrophilic, and wherein the photosensitive resin layer comprises the above-described photosensitive resin composition.

The PS plate preferably has an oxygen-barrier overcoat layer mainly comprising polyvinyl alcohol on the photosensitive resin layer thereof.

An object of the second aspect of the present invention is to provide a photosensitive resin composition which not only has high sensitivity to low-energy visible light, but which also assures high resolution and a large development margin.

Another object of the second aspect of the present invention is to provide a highly sensitive PS plate using the above described resin composition.

It is still another object of the second aspect of the present invention to provide a highly sensitive color filter using the above described resin composition.

The above objectives of the second aspect of the present invention are achieved by providing a photosensitive resin composition comprising a polymeric binder, a monomer having an ethylenically unsaturated double bond and photopolymerization initiators, said resin composition containing an acridine compound and at least one triazine compound represented by the following formulae (VII), (VIII) and (IX) as said photopolymerization initiators:

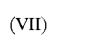

(VII)

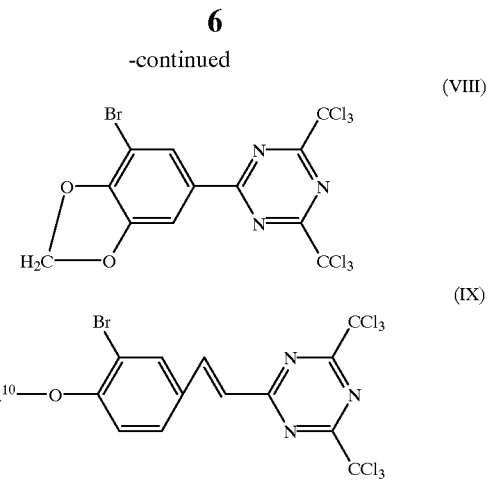

wherein $R^9$ and $R^{10}$ each independently represents an alkyl group having 1 to 3 carbon atoms (e.g., $CH_2$, $C_2H_5$ and $C_3H_7$).

Because of the inclusion of an acridine compound and a triazine compound which is at least one of the compounds represented by the above formulae (VII) to (IX) as photopolymerization initiators, the photosensitive resin composition of the present invention exhibits extremely high sensitivity due to the synergistic effect of the combination of the triazine compound with the acridine compound, and thus enables high-resolution exposure even if a low-energy light source is used. Furthermore, the photosensitive resin composition of the present invention has a sufficiently large development margin to increase the yield of the development step.

The above second aspect of the present invention also provides a color filter which is produced by dispersing a pigment in the above-described photosensitive resin composition, applying the thus obtained photosensitive resin composition for a color filter onto a substrate, exposing said photosensitive resin composition through a pattern mask, and developing to form a relief resin layer having a desired pattern.

The above second aspect of the present invention further provides a PS plate that is produced by surface-graining an aluminum substrate, anodizing the grained surface to form an anodic oxide film, rendering the surface thereof hydrophilic, and forming the above-described photosensitive resin composition on the thus treated aluminum substrate.

BRIEF DESCRIPTION OF THE DRAWINGS

FIG. 3 is a diagram showing a process for producing a color filter in accordance with the second aspect of the present invention, in which

DETAILED DESCRIPTION OF THE INVENTION

Figure 1:
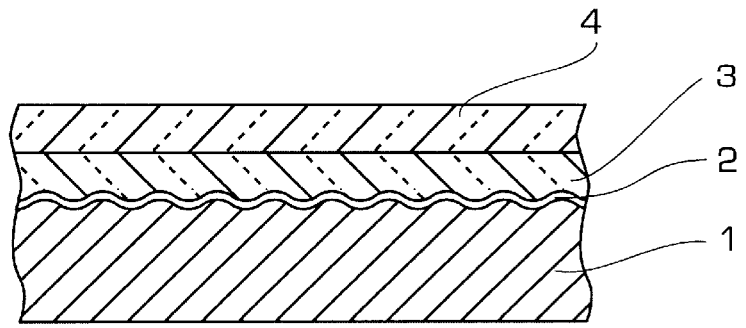
FIGS. 1 and 2 each shows a cross section of a PS plate according to the first aspect of the present invention.

Next, the first aspect of the present invention is described in detail below.

Specific examples of the triazine compounds represented by formulae (I), (II), (III) and (V) which can be used as a photopolymerization initiator in the first aspect of the present invention are shown below for illustrative purposes only but not for limitation. Compounds (8) and (9) below are not within the scope of formulae (I) to (V), but are nonetheless specific triazine compounds which can be used in the present invention.

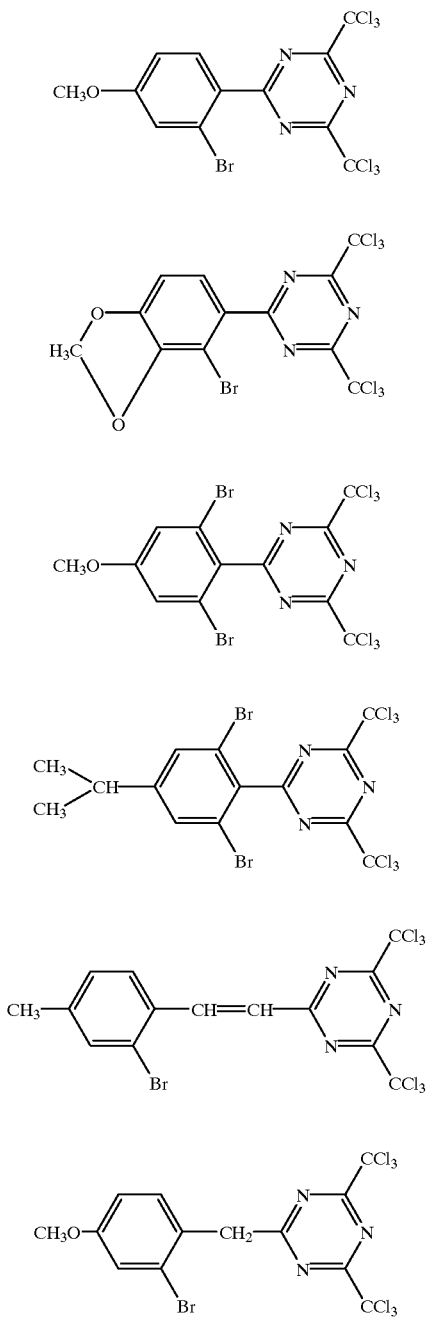

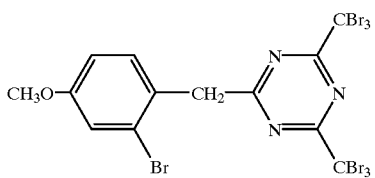

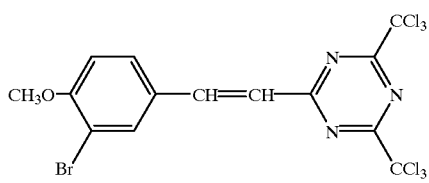

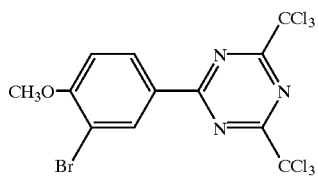

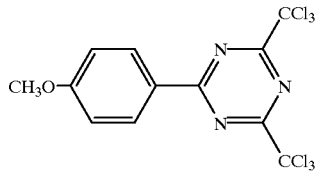

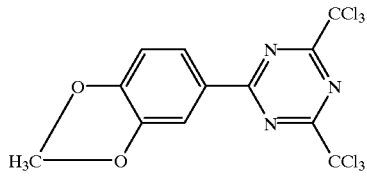

Among these compounds, preferred are Compounds (1) and (10).

These triazine compounds can be obtained by, for example, reacting trichloroacetonitrile with a compound having a cyano end group in the presence of sodium hydroxide as a catalyst. The thus prepared triazine compounds are usually high-melting needle crystals having a melting point between 100° C. and 300° C. and assuming a pale yellow to orange color.

As compared with conventional triazine compounds, the compounds according to the first aspect of the present invention exhibit significantly improved solubility in the solvents hereinafter described due to a bromine atom introduced into the phenyl nucleus thereof or a specific trihalomethyl group introduced into the triazine nucleus. As a result, they have highly increased sensitivity to light and improved developability. They also have improved sensitivity to visible light sufficient to cure with argon laser light.

The PS plate having a photosensitive resin layer comprising the photosensitive resin composition of the first aspect of the present invention can achieve imaging with argon laser light without using a film original. Therefore, it has high image formation precision and reduces the number of steps for plate making.

If desired, the photopolymerization initiator according to the first aspect of the present intention may be used in combination with known initiators for further improving sensitivity. Specific but non-limiting examples of other useful initiators include anthraquinone and derivatives thereof (e.g., 2-methylanthraquinone, 2-ethylanthraquinone), benzoin and derivatives thereof (e.g., benzoin methyl ether, benzoin ethyl ether), thioxanthone derivatives (e.g., chlorothioxanthone, diisopropylthioxanthone), benzophenone and derivatives thereof (e.g., 4,4'-bis(dimethylamino)benzophenone), acetophenone and derivatives thereof (e.g., dimethoxyphenylacetophenone), Michler's ketone and benzil.

Preferably, a titanocene compound and/or an acridine compound such as 9-phenylacridine and a triazine compound represented by formulae (I) to (V) are used in combination as the photopolymerization initiator of the present invention to provide a photosensitive resin composition sensitive to visible light of relatively low energy, such as argon laser light.

The titanocene compound, which imparts sensitivity to visible light to a high polymeric binder, includes a compound represented by formula (VI) shown below as disclosed in JP-A-2-127404, JP-A-3-27393, and JP-A-3-239703.

(VI)

wherein $R^5$ and $R^6$, which may be the same or different, each represents a substituted or unsubstituted cyclopentadienyl group; and $R^7$ and $R^8$, which may be the same or different, each represents a substituted or unsubstituted phenyl group.

The titanocene compound is preferably used in an amount of from 10 to 30 parts by weight, more preferably from 12 to 20 parts by weight, based on 100 parts by weight of the total solids content of the photosensitive resin composition. The total solids content of the photosensitive resin composition means a total of a high polymeric binder, an ethylenically unsaturated monomer and a photopolymerization initiator. It is difficult to achieve a sufficient increase in sensitivity to visible light with less than 10 parts by weight of the titanocene compound. If the amount of the titanocene compound is more than 30 parts by weight, a reduction in film strength of the resulting cured film may result.

The triazine compounds according to the first aspect of the present invention are characterized by a structure having a bromine-substituted phenyl group, a piperonyl group and/or a substituted styryl group as well as their physical properties as compared with conventionally employed bis-trihalomethyltriazine compounds or tristrihalomethyltriazine compounds. By virtue of these characteristics, the triazine compounds of the first aspect of the invention raise the sensitivity of a photosensitive resin composition about ten times over a titanocene compound used alone.

In order to suppress reduction in sensitivity due to air oxidation of the photosensitive resin composition, an acridine compound is preferably used in combination therewith. Examples of suitable acridine compounds are 9-phenylacridine, 9-(4-substituted)phenylacridine, 9-substituted-aminoacridine, 1,7-bis(9-acridinyl)heptane, 1,5-bis(9-acridinyl)pentane and 1,3-bis(9-acridinyl)propane.

The acridine compound is preferably used in an amount of from 0.1 to 10 parts by weight, more preferably from 0.5 to 5 parts by weight, based on 100 parts by weight of the total solids content of the photosensitive resin composition. If the amount of the acridine compound is less than 0.1 parts by weight, the effect of preventing sensitivity reduction due to oxygen may not be fully exerted as expected in some cases. The acridine compound in amounts exceeding 10 parts by weight are apt to bring about undesired effects, such as an abrupt reduction in development rate and production of a development residue.

In addition to the above-mentioned components, the photosensitive resin composition of the first aspect of the present invention preferably contains a coumarin compound as a sensitizer for further increasing its sensitivity. Suitable coumarin compounds include those represented by formulae (i) and (ii) shown below and commercially available compounds, such as LS-157, LS-153 and LS-158, produced by Mitsui Toatsu Chemicals, Inc.

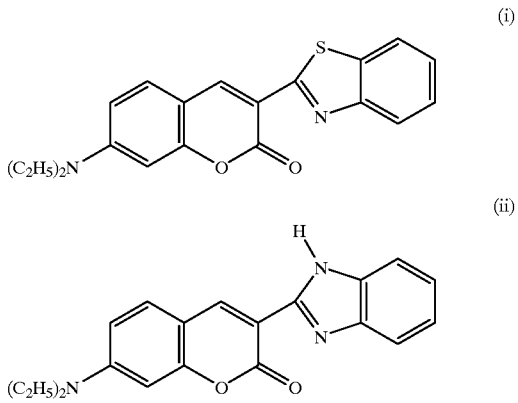

The coumarin compound is preferably added in an amount so as to adjust the absorbance of the photosensitive resin composition to a range of from 0.1 to 1.5, more preferably from 0.3 to 0.8, at 488 nm. If the absorbance is less than 0.1 or more than 1.5, a reduction in sensitivity is apt to result in some cases.

The triazine compounds represented by formulae (I) to (V) are preferably used either individually or in combination of two or more thereof in a total amount of from 0.1 to 15 parts by weight, more preferably from 0.5 to 5 parts by weight, based on 100 parts of the total solids content of the photosensitive resin composition. If the amount is less than 0.1 parts by weight, no improvement in sensitivity is shown in some cases. If it is more than 15 parts by weight, a non-developed residue or foreign matter due to insufficient dissolution tends to be produced. In addition to the triazine compounds of the invention, known trihalomethyltriazine compounds may be added in combination in a total amount not exceeding 50% by weight of the total triazine compounds.

The polymeric binders which can be used in the first aspect of the present invention include homo- or copolymers of monomers selected from compounds having a phenolic hydroxyl group (e.g., p-hydroxyphenyl (meth)acrylate), compounds having an aliphatic hydroxyl group (e.g., 2-hydroxyethyl (meth)acrylate), substituted or unsubstituted alkyl (meth)acrylates, (meth)acrylamides, vinyl ethers, vinyl esters, vinyl ketones, alkylene-substituted aromatic compounds (e.g., styrene), olefins, (meth)acrylonitriles and compounds having an unsaturated double bond (e.g., acrylic acid).

Specific examples of suitable polymeric binders are polyamide, polyvinyl esters, polyvinyl acetal, polyvinyl ethers, epoxy resins, alkyd resins, polyethylene oxide, polyvinylmethylacetamide, polyvinylmethylformamide, polyvinylpyrrolidone, polydimethylacrylamide, chlorinated polyethylene, chlorinated polypropylenen and polyalkyl acrylates.

Additionally, alkyl acrylate-acrylonitrile copolymers, polyvinyl chloride, vinyl chloride-acrylonitrile copolymers, polyvinylidene chloride, vinylidene chloride-acrylonitrile copolymers, polyvinyl acetate, polyvinyl alcohol, acrylonitrile-styrene copolymers, acrylonitrile-styrene-butadiene copolymers, polystyrene, polymethylstyrene, polyurethane, methyl cellulose, acetyl cellulose, polyvinyl formal and polyvinyl butyral may also be used as a binder.

Addition of an organic acid, such as a carboxylic acid, to the above-mentioned monomers provides alkali-developable binders. In this case, the alkali-developable polymeric binders preferably have an acid value between 100 and 150 and a weight-average molecular weight of 10,000 to 200,000. Polymeric binders containing a hydroxyl or carboxylic group may be modified with glycidyl (meth) acrylate, etc. to have an additional unsaturated double bond.

When the carboxyl-containing high polymeric binder is a copolymer, the copolymer is preferably prepared in the presence of a monomer having an unsaturated double bond (e.g., (meth)acrylic acid or crotonic acid), a copolymer of maleic anhydride or a half ester thereof, a reaction product between a hydroxyl-containing copolymer and an acid anhydride, and the like.

Preferred combinations of monomers of the polymeric binders include a combination of methacrylic acid/methyl methacrylate/benzyl methacrylate/hydroxyphenyl methacrylate and a combination of methacrylic acid/methyl methacrylate/styrene/hydroxyphenyl methacrylate.

The monomers containing an ethylenically unsaturated double bond which can be used in the present invention preferably include monomers or oligomers containing at least one, and preferably two or more addition polymerizable ethylenically unsaturated groups, having a weight-average molecular weight of 5,000 or less, and having a boiling point of 100° C. or higher at atmospheric pressure.

Specific examples of such monomers or oligomers include (meth)acrylic acid, (meth)acrylic ester (e.g., methyl (meth)acrylate and ethyl (meth)acrylate), (meth)acrylamide, (meth)acrylonitrile, allyl compound, vinyl ether, vinyl ester, ethylene glycol mono(meth)acrylate, ethylene glycol di(meth)acrylate, polyethylene glycol mono(meth)acrylate, polyethylene glycol di(meth)acrylate, polypropylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol hexa(meth)acrylate, hexanediol di(meth)acrylate, tri (acryloyloxyethyl) isocyanurate, (meth)acrylate of an ethylene oxide- or propylene oxide-added polyhydric alcohol (e.g., glycerol), urethane acrylate compound and epoxy acrylate compound.

Preferred among the ethylenically unsaturated monomers are monomers having a polyfunctional group.

Monomers having a polyfunctional group serving as a crosslinking agent preferably include ethylene glycol diacrylate, ethylene glycol di(meth)acrylate, triethylene glycol diacrylate, triethylene glycol di(meth)acrylate, tetraethylene glycol diacrylate, tetraethylene glycol di(meth) acrylate, propylene glycol diacrylate, propylene glycol di(meth)acrylate, trimethylolpropane triacrylate, trimethylolpropane tri(meth)acrylate, pentaerythritol triacrylate, pentaerythritol tri(meth)acrylate, pentaerythritol tetraacrylate, pentaerythritol tetra(meth)acrylate, dipentaerythritol pentaacrylate, dipentaerythritol penta(meth) acrylate, dipentaerythritol hexaacrylate, dipentaerythritol hexa(meth)acrylate and carboepoxy diacrylate.

Among them, more preferred are trimethylolpropane triacrylate, trimethylolpropane tri(meth)acrylate, pentaerythritol triacrylate, pentaerythritol tri(meth)acrylate and pentaerythritol tetraacrylate.

If desired, the photosensitive resin composition of the first aspect of the present invention may further contain known additives, such as thermal polymerization initiators (e.g., methyl hydroquinone), antifoaming agents and dyes. When the photosensitive resin composition is used as a photosolder resist composition or a plating resist composition, additives such as fine particles of metals or metal oxides (e.g., copper, brass, aluminum, silicon oxide, aluminum oxide, magnesium oxide) and fine particles of plastics compatible with the photosensitive resin composition may be preferably added in an amount of from 1 to 40 parts by weight per 100 parts by weight of the total solids content of the photosensitive resin composition.

The compounding ratio of the above-mentioned components in the photosensitive resin composition more or less varies depending on its final use (e.g., use for a PS plate, a letterpress printing plate, a printed circuit board). Preferably, the photosensitive resin composition comprises from 10 to 60 parts by weight of the polymeric binder, from 20 to 70 parts by weight of the ethylenically unsaturated monomer, and from 0.1 to 30 parts by weight of photopolymerization initiator, including from 0.1 to 15 parts by weight of the triazine compound represented by formulae (I) to (V) and other photopolymerization initiators such as a titanocene compound, an acridine compound, etc., each based on 100 parts by weight of the total solids content of the photosensitive resin composition.

The photosensitive resin composition is prepared by mixing the above-mentioned components with the aid of from 10 to 1,000 parts by weight of a known solvent, such as alkylene glycol mono(or di)alkyl ethers, ketones, alcohols and carboxylic acid esters, per 100 parts by weight of the total solids content of the photosensitive resin composition.

The photosensitive resin composition according to the present invention is useful as a photoresist, a photosolder resist or a plating resist in the production of various printing plates, such as a letterpress printing plate, an intaglio printing plate, a litho printing plate, etc. or printed circuit boards, a resist for preparing a color filter or a black matrix of a liquid crystal display or a plasma display, and a photopolymerizable paste composition.

When the composition is used for the production of a printing plate, it is coated on a substrate (e.g., metal, plastic) to form a photosensitive resin layer. Suitable examples of such substrates include plates of metals, such as iron, aluminum, zinc, copper, brass and stainless steel; synthetic resins, such as polyethylene terephthalate (PET), nylon, polyethylene, polypropylene and acrylic resins, shaped into a plate or a film according to the specifications of a printing machine used; and laminates of the resin films prepared by using an adhesive, etc.

A resist can be prepared from the photosensitive resin composition by using an argon laser as a light source as follows. The composition is first diluted with a known organic solvent, such as methyl ethyl ketone, toluene, ethylene glycol monomethyl ether and 2-methoxyethanol, to a solid content of about 5 to 20% by weight. The coating composition is coated on a substrate, such as an aluminum plate, or, in the case of preparing a dry film resist, on a PET film to a dry film thickness of from 1 to 4 g/m$^2$ and dried in an air flow at room temperature to form a photosensitive resin layer.

It is preferable to provide an oxygen-barrier overcoat layer mainly comprising polyvinyl alcohol (PVA) on the photosensitive resin layer. The overcoat layer may consist of PVA, or polyalkylenealcohol (weight-average molecular weight: 250 to 1,000) may be added to the overcoat layer in an amount of from 10 to 70 parts based on 100 parts of PVA. The PVA preferably has a weight-average molecular weight of 300 to 1,000 and a degree of saponification (i.e., rate of hydrolysis of an acetyl group) of 70 to 90%. For easy coating, PVA is used as diluted with water to a solid content of 5 to 20% by weight. In preparing a PVA aqueous solution, approximately the same amount of silicon dioxide powder as PVA and an adequate amount of a surface active agent, e.g., a nonylphenyl ethylene oxide adduct, are preferably added. The overcoat layer is preferably coated to a dry film thickness of 1 to 2 $\mu$m.

The thus prepared film cures with high sensitivity on imagewise exposure to 1 to 3 mJ/cm$^2$ of argon laser light (wavelength: 488 nm). The exposure time is preferably from about 30 minutes to about 1 hour. Exposure to laser light is carried out by scanning with a laser beam emitted from a fine nozzle according to instructions from a controller so that imaging can be effected with far higher precision than with conventional imaging by UV irradiation using a film original. Use of a laser as a light source also simplifies the operation. After exposure, the film is developed by brushing in a developer, for example, a dilute sodium carbonate aqueous solution at room temperature for about 1 minute to form a resist pattern.

The thus prepared resist pattern is suitable as a resist against etching in the production of a PS plate, a letterpress printing plate, an intaglio printing plate, a printed circuit board, and so forth.

A PS plate, a precursor of a litho printing plate, etc., is usually prepared by using an aluminum or aluminum alloy plate as a substrate in the same manner as for a resist as described above. Examples of suitable aluminum or aluminum alloy plates include those specified in JIS A-1050, JIS A-1100, JIS A-3003, JIS A-3103 and JIS A-5005.

The aluminum plate is first subjected to mechanical surface graining. If desired, the aluminum plate may be subjected to a pretreatment for removing a rolling lubricant from the surface or a pretreatment for exposing a clean aluminum surface with a solvent (e.g., trichloroethylene), a surface active agent or a sodium silicate for the former pretreatment, and with an alkali etching solution of sodium hydroxide, potassium hydroxide, etc. for the latter pretreatment. Mechanical surface graining of an aluminum plate can be carried out by various known methods, for example, by sandblasting, ball graining, wire graining and brush graining, with brush graining being preferred. For the details of brush graining, reference is made to U.S. Pat. No. 3,891,516 (corresponding to JP-B-51-46003) and JP-B-50-40047 (the term "JP-B" as used herein means an "examined published Japanese patent application"). Mechanical surface graining is preferably performed to provide an average center-line surface roughness Ra (according to JIS B 0601) of from 0.2 to 1.0 $\mu$m. By the mechanical surface graining, the surface of the aluminum plate is provided with unevenness at relatively large intervals (primary structure) and fine projections (secondary structure) all over the uneven surface.

The mechanically grained aluminum plate is then chemically etched in order to clear off from the surface any remaining abrasive and aluminum dust and to remove the fine projections thereby to facilitate uniform and effective achievement of subsequent electrochemical surface roughening. The chemical etching is carried out by soaking the aluminum plate in an aqueous solution of an acid or base capable of dissolving aluminum. For details, reference is made to U.S. Pat. No. 3,834,998. Suitable acids include sulfuric acid, persulfuric acid and hydrochloric acid, and suitable bases include sodium hydroxide, potassium hydroxide, sodium tertiary phosphate, sodium secondary phosphate, potassium tertiary phosphate, potassium secondary phosphate, sodium aluminate and sodium carbonate. A basic aqueous solution is preferred as an acidic etching solution for its higher etching rate. When chemical etching is effected with a basic aqueous solution, smut is generally produced on the aluminum surface. This being the case, the aluminum plate is preferably subjected to desmutting with phosphoric acid, nitric acid, sulfuric acid, chromic acid or a mixed acid containing two or more of these acids.

The thus treated aluminum plate is then electrochemically roughened in an acidic electrolytic solution comprising an aqueous solution of nitric acid, hydrochloric acid, a mixture of nitric acid and hydrochloric acid, and a mixture of these acids and others, such as organic acids, sulfuric acid and phosphoric acid. The electrolytic bath may contain a corrosion inhibitor (or a stabilizer). The electrochemical surface roughening may be conducted in any of a batch system, a semi-continuous system and a continuous system.

After completion of the electrolytic surface roughening, the aluminum plate is again subjected to chemical etching with a base, such as sodium hydroxide. This chemical etching is carried out in the same manner as in the above-described chemical etching using a base. The chemical etching is preferably followed by desmutting with phosphoric acid, nitric acid, sulfuric acid, chromic acid, etc.

The surface roughened aluminum plate is then subjected to anodizing to form an aluminum oxide on the surface of the aluminum plate in accordance with well-known procedures. For example, anodizing is carried out in an electrolytic solution comprising an aqueous or non-aqueous solution of sulfuric acid, phosphoric acid, oxalic acid, chromic acid, amidosulfonic acid, a mixture of two or more of these acids, which may contain an Al$^{+3}$ ion, by mainly using a direct current. An alternating current or a combination of a direct current and an alternating current may also be used.

The anodized aluminum plate may further be subjected to treatment for rendering the surface hydrophilic by, for example, immersion in an aqueous solution of an alkali metal silicate, e.g., sodium silicate, as taught in U.S. Pat. Nos. 2,714,066 and 3,181,461. The silicate treatment is preferably followed by a treatment for further rendering the surface hydrophilic with phosphonic acid.

If desired, an undercoat layer comprising a high polymer containing a sulfonic group-containing monomer unit as described in JP-A-59-101651 or an undercoat layer comprising a compound containing an —NH$_4$ group, a —COOH group or an —SO$_3$H group may be provided on the aluminum plate.

The resulting aluminum substrate is coated with the photosensitive resin composition of the present invention to obtain a litho printing plate precursor, such as a PS plate, having a photosensitive resin layer. Coating is carried out by means of a bar coater, a foiler, and the like. The coated composition is then dried, for example, at about 80° C. for 4 to 8 minutes. The dry film thickness thereof is generally from 1 to 10 g/m², preferably from 2 to 4 g/m². If the dry thickness is less than 1 g/m², the resulting printing plate is apt to have poor printing durability and poor ink receptivity. If it is more than 10 g/m², the printing plate precursor is apt to have impractical sensitivity.

If desired, an oxygen-barrier overcoat layer mainly comprising PVA may be provided on the photosensitive resin layer by means of a roller coater, a foiler, etc. Drying of the overcoat layer is effected, for example, at about 80° C. for 1 to 3 minutes.

Next, the second aspect of the present invention is described in detail below.

Examples of the polymeric binder that may be used as a component of the photosensitive resin composition of the present invention include those obtained by copolymerizing monomers such as acrylic acid, methacrylic acid, methyl acrylate, methyl methacrylate, ethyl acrylate, ethyl methacrylate, 2-hydroxyethyl acrylate, 2-hydroxyethyl methacrylate, 2-hydroxypropyl methacrylate, hydroxyphenyl acrylate, hydroxyphenyl methacrylate, n-butyl acrylate, n-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate, glycidyl methacrylate, styrene, acrylamide and acrylonitrile. To enable development of the photosensitive resin composition with alkalis, the copolymer preferably contains from about 5 to 40% by weight of acrylic acid and/or methacrylic acid.

The content of this polymeric binder ranges from about 10 to 60% by weight, preferably from about 20 to 40% by weight, based on the solids content in the photosensitive resin composition. If the content of the polymeric binder is smaller than 10% by weight, an excellent dry film cannot be obtained by drying after application and the resin exhibits insufficient strength after curing. If the content of the polymeric binder exceeds 60% by weight, the development properties are deteriorated.

Examples of the monomer having an ethylenically unsaturated double bond which for use in the photosensitive resin composition of the second aspect of the present invention include, but are not limited to, methyl acrylate, methyl methacrylate, 2-hydroxyethyl acrylate, 2-hydroxyethyl methacrylate, 2-hydroxypropyl methacrylate, ethylene glycol diacrylate, ethylene glycol dimethacrylate, triethylene glycol diacrylate, triethylene glycol dimethacrylate, tetraethylene glycol diacrylate, tetraethylene glycol dimethacrylate, propylene glycol diacrylate, propyleneglycol dimethacrylate, trimethylolpropane triacrylate, trimethylolpropane trimethacrylate, tetramethylolpropane tetraacrylate, tetramethylolpropane tetramethacrylate, pentaerythritol triacrylate, pentaerythritol trimethacrylate, pentaerythritol tetraacrylate, pentaerythritol tetramethacrylate, dipentaerythritol pentaacrylate, dipentaerythritolpentamethacrylate, dipentaerythritol hexaacrylate, dipentaerythritol hexamethacrylate, 1,6-hexanediol diacrylate, benzyl acrylate, benzyl methacrylate and carboethoxy diacrylate.

The content of this monomer having an ethylenically unsaturated double bond ranges from about 15 to 70% by weight, preferably from about 20 to 40% by weight, based on the solids content in the photosensitive resin composition. If its content is smaller than 15% by weight, photocuring is insufficient to achieve adequate heat resistance or chemical resistance. If the content of the monomer exceeds 70% by weight, the coating properties of the photosensitive resin composition are deteriorated.

The photopolymerization initiator for use as a component of the photosensitive resin composition of the second aspect of the present invention contains both an acridine compound and a triazine compound. As the triazine compound, at least one of the compounds represented by the above formulae (VII), (VIII) and (IX), wherein R⁹ and R¹⁰ each have the same meaning as defined above, is employed.

Examples of the acridine compound include 9-phenylacridine, 1,7-bis(9-acridinyl)heptane, 1,5-bis(9-acridinyl)pentane and 1,3-bis(9-acridinyl)propane. Among these compounds, 9-phenylacridine is particularly suitable. These acridine compounds may be used either individually or in any combinations.

Examples of the triazine compound include 2-(3'-bromo-4'-methoxyphenyl)-4,6-bis(trichloromethyl)-s-triazine, 2-(3'-bromo-4'-ethoxyphenyl)-4,6-bis(trichloromethyl)-s-triazine, 2-(3'-bromo-4',5'-methylenedioxyphenyl)-4,6-bis(trichloromethyl)-s-triazine, 2-(3'-bromo-4'-methoxystyryl)-4,6-bis(trichloromethyl)-s-triazine and 2-(3'-bromo-4'-ethoxystyryl)-4,6-bis(trichloromethyl)-s-triazine. Among these compounds, 2-(3'-bromo-4'-ethoxyphenyl)-4,6-bis(trichloromethyl)-s-triazine, 2-(3'-bromo-4',5'-methylenedioxyphenyl)-4,6-bis(trichloromethyl)-s-triazine and 2-(3'-bromo-4'-ethoxystyryl)- 4,6-bis(trichloromethyl)-s-triazine are particularly suitable. These triazine compounds may be used either individually or in any combinations.

The compounding ratio by weight of the acridine compound to the triazine compound ranges preferably from 1:80 to 8:1, more preferably from 1:10 to 2:1, on a weight basis. If the compounding ratio is outside the above defined range, the desired effects of the present invention cannot be achieved due, for example, to deterioration in sensitivity or a reduction in the development margin.

In the present invention, the sensitivity and the development margin of the photosensitive resin composition can be further improved by using a photopolymerization initiator which contains 2-benzyl-2-dimethylamino-1-(4-morpholinophenyl)butane-1-one represented by the following formula (X) in addition to the acridine compound and triazine compound described above.

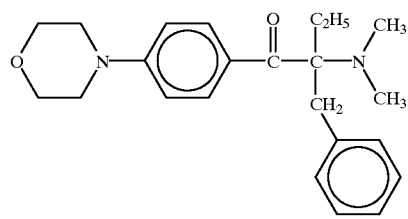

(X)

In this case, the compounding ratio on a weight basis between this 2-benzyl-2-dimethylamino-1-(4-morpholinophenyl)butane-1-one and the above-mentioned acridine and triazine compounds is preferably adjusted to 1:(0.05–2):(0.25–4), more preferably to 1:(0.2–1):(0.5–2).

The content of the above-mentioned photopolymerization initiator ranges from 1 to 40 parts by weight, preferably from 5 to 25 parts by weight, per 100 parts by weight of the solids content in the photosensitive resin composition. If the content of the photopolymerization initiator is less than 1 part by weight, only insufficient curing occurs. If the content of the photopolymerization initiator exceeds 40 parts by weight, dispersibility of pigment may sometimes be deteriorated.

In the present invention, conventionally known photopolymerization initiators may be used, as required, in addition to the ones described above. Specific examples of the conventionally known photopolymerization initiators include, but are not limited to, benzophenone and its derivatives such as 4,4'-bis(dimethyl-amino)benzophenone and 3,3-dimethyl-4-methoxy-benzophenone; anthraquinone and its derivatives such as 2-methyl-anthraquinone, 2-ethyl-anthraquinone and tert-butyl-anthraquinone; benzoin and benzoin alkyl ether derivatives such as benzoin methyl ether, benzoin ethyl ether and benzoin propyl ether; acetophenone and its derivatives such as 2,2-dimethoxy-2-phenylacetophenone, 2,2-diethoxyacetophenone, 2-hydroxy-2-methylpropiophenone, 4'-isopropyl-2-hydroxy-2-methylpropiophenone and 2-methyl-1-[4-(methylthio)phenyl]-2-morpholino- 1-propanone; thioxanthone derivatives such as 2-chlorothioxanthone, diethylthioxanthone, isopropylthioxanthone and diisopropylthioxanthone; benzyl-2,4,6-(trichloromethyl)-triazine, 2-(o-chlorophenyl)-4,5-diphenylimidazolyl dimer, dimethylbenzyl ketal, trimethyl-benzoyldiphenylphosphine oxide and tribromomethylphenyl-phosphine. The sensitivity of the photosensitive resin composition can be further improved by selectively adding from 0.05 to 2 parts by weight of 2-(o-chlorophenyl)-4,5-diphenylimidazolyl dimer per part by weight of the triazine compound of the second aspect of the present invention.

In the second aspect of the present invention, conventionally known solvent components may be used for such purposes as improving the coating properties of the photosensitive resin composition and controlling its viscosity. Examples of usable solvents include benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerol, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 3-methoxybutyl acetate and 3-methyl-3-methoxybutyl acetate. Among these, 3-methoxybutyl acetate and 3-methyl-3-methoxybutyl acetate are preferably selected, since they are excellent in the ability to solubilize the solids content in the photosensitive resin composition and because they permit efficient dispersion of the insoluble pigment particles described hereinafter.

The solvent component may be used in an amount of from 50 to 500 parts by weight per 100 parts by weight of the solids content in the photosensitive resin composition.

When the above-mentioned photosensitive resin composition of the second aspect of the present invention is to be used in a color filter, a desired pigment is further added to provide a photosensitive resin composition for a color filter. The pigment for use in the photosensitive resin composition of the second aspect of the present invention can be selected, without particular limitation, from among those employed in conventional photosensitive resin compositions. For example, the following have excellent transparency, heat resistance, weatherability and chemical resistance, and may be used with advantage.

Yellow pigments: [C.I.(color index)] 20, 24, 83, 86, 93, 109, 110, 117, 125, 137, 138, 147, 148, 153, 154, 166 and 168.
Orange pigments: C.I. 36, 43, 51, 55, 59 and 61.
Red pigments: C.I. 9, 97, 122, 123, 149, 168, 177, 180, 192, 215, 216 or 217, 220, 223, 224, 226, 227, 228 and 240.
Purple pigments: C.I. 19, 23, 29, 30, 37, 40 and 50.
Blue pigments: C.I. 15, 15:6, 22, 60 and 64.
Green pigments: C.I. 7 and 36.
Brown pigments: C.I. 23, 25 and 26.

When a light-shielding film such as a black stripe or a black matrix is to be formed, carbon black, titanium black, chromium oxide, iron oxide, aniline black, perylene pigments, etc. can be used.

The content of the pigment component ranges from 15 to 75% by weight based on the solids content in the photosensitive resin composition. If the content of the pigment is less than 15% by weight, a color filter that employs such composition cannot sufficiently cut off light of wavelengths other than that for color formation. If the content of the pigment exceeds 75% by weight, no patterns can be formed due to the relative decrease in the photosensitive components.

When a color filter or a PS plate for lithography is produced using the above-mentioned photosensitive resin composition of the second aspect of the present invention, a product having high resolution, excellent fine-line reproducibility and a large development margin can be obtained. This photosensitive resin composition is also usable as an etching resist for a printed wiring board, etc.

Figure 3A:
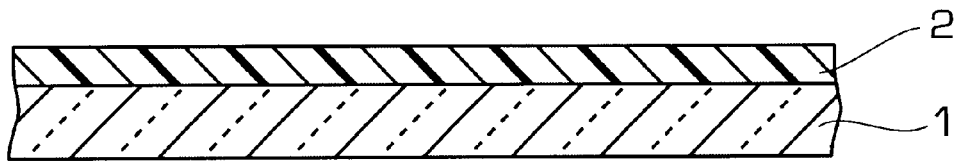
FIG. 3A shows the application of a photosensitive resin composition for a color filter onto a substrate.
Figure 3B:
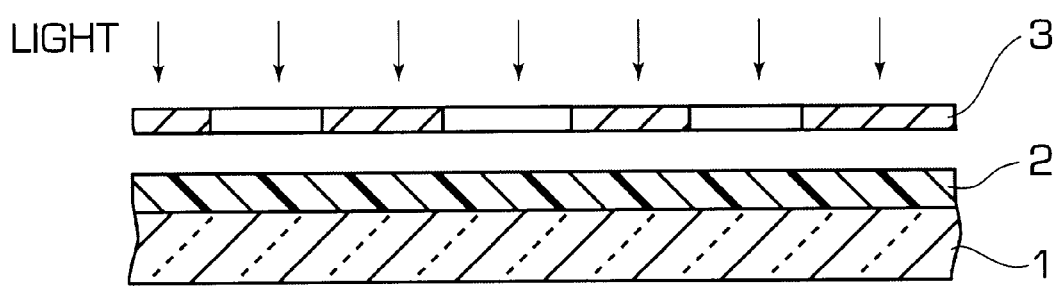
FIG. 3B shows the exposure of the photosensitive resin composition.
Figure 3C:
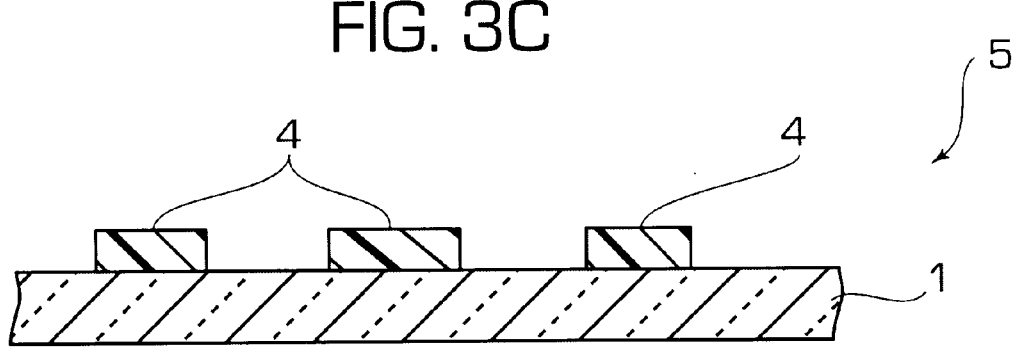
FIG. 3C shows the formation of a relief resin layer.

To produce the color filter of the second aspect of the present invention, a desired pigment is first dispersed and incorporated into the above-mentioned photosensitive resin composition to thereby produce a photosensitive resin composition for a color filter. Next, this photosensitive resin composition for a color filter is applied onto a substrate 1 to thereby form a photosensitive resin layer 2 (FIG. 3A). Then, it is exposed through a pattern mask (a negative mask) (FIG. 3B) followed by developing and baking. Thus, a relief resin layer 4 having a desired pattern is formed and a color filter 5 is produced (FIG. 3C).

Figure 4:
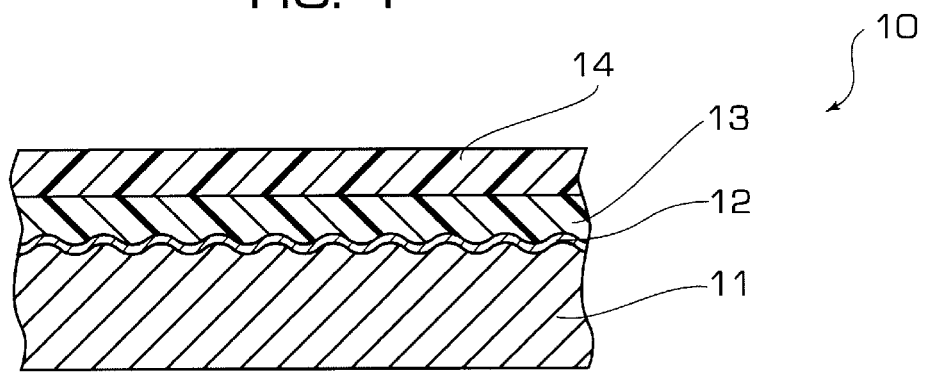
FIG. 4 is a diagram showing the constitution of the PS plate in accordance with the second aspect of the present invention.

The PS plate of the second aspect of the present invention can be produced in the following manner. As FIG. 4 shows, a surface-grained aluminum substrate 11 is anodized to form an oxide coating 12. After the surface of this oxide coating 12 is rendered hydrophilic, the photosensitive resin composition of the present invention is applied to form a photosensitive resin layer 13. Furthermore, an overcoat layer 14 mainly comprising polyvinyl alcohol may be formed as needed. Thus, a PS plate 10 can be prepared. If this PS plate 10 is to be used, for example, in lithography, a pattern is formed by direct drawing through scanning exposure to a suitable light source such as an argon laser.

Methods for producing the color filter and the PS plate will be described in greater detail hereinbelow.

I. Color Filter (1) Preparation of Photosensitive Resin Composition for a Color Filter:

A desired pigment is dispersed and incorporated into the above-mentioned photosensitive resin composition of the second aspect of the present invention. Furthermore, optional components such as a solvent, a dye, a dispersion aid and a defoaming agent are added as needed. Then, the thus obtained blend is thoroughly kneaded, for example, with a three-roll mill, a ball mill or a sand mill. Dispersion and incorporation of the pigment may be effected in accordance with a method commonly employed in the art.

(2) Application of Photosensitive Resin Composition for a Color Filter onto a Clean Substrate:

The above-mentioned photosensitive resin composition is applied onto a substrate which has been washed to provide a clean surface. The substrate may advantageously be made of glass. To improve the adhesion of the photosensitive resin composition to the glass substrate, a silane coupling agent may preliminarily be added to the photosensitive resin composition or allowed to act on the substrate. The photosensitive resin composition may be applied onto the substrate with a contact transfer applicator such as a roll coater, a reserve coater or a bar coater or a noncontact applicator such as a spinner or a curtain-flow coater.

To form a thick coating film, application may be repeated several times or two or more applicators may be used. Then, the coated substrate is left to stand at room temperature for several hours to several days or placed in a warm air heater or an infrared heater for several tens of minutes to several hours, to thereby eliminate the solvent. Thus, the thickness of the coating film is controlled to about 1 to 100 μm.

(3) Exposure:

After completing the application, the coated substrate is exposed through a mask pattern (a negative mask). Appropriate examples of an active energy radiation for use in the exposure include UV light, argon laser light and excimer laser light. The photosensitive resin composition of the second aspect of the present invention is highly sensitive, so the irradiation energy dose can be adjusted to about 30 to 1000 mJ/cm$^2$, preferably about 50 to 100 mJ/cm$^2$, although it is somewhat variable with the type of photosensitive resin composition to be used. Namely, the photosensitive resin composition of the second aspect of the present invention can be exposed at a lower irradiation energy dose than a conventional one that is employed in the pigment dispersion method and which requires an irradiation energy dose of at least 150 mJ/cm$^2$.

(4) Development

Following the exposure, development is performed, for example, by the dip method or the spray method using a liquid developer. Useful liquid developers include organics such as monoethanolamine, diethanolamine and triethanolamine, as well as aqueous solutions of sodium hydroxide, potassium hydroxide, sodium carbonate, ammonia, quaternary ammonium salts, etc. Because of the large development margin allowable in the development step, the photosensitive resin composition of the second aspect of the present invention enables excellent development processing even if it lasts for a sufficiently long time that not only unexposed areas but also exposed areas would be stripped with the use of conventional photosensitive resin compositions.

II. PS Plate

First, a photosensitive resin composition of the second aspect of the present invention is prepared in the same manner as in the above-mentioned case for the production of a color filter, except that a pigment is not incorporated therein.

This photosensitive resin composition is then applied onto an oxide coating film on an aluminum substrate that has been formed by anodization (which is then rendered hydrophilic), or, in the case of preparing a dry film, onto a polyethylene terephthalate (PET) film; and the applied resin composition is then dried to form a photosensitive resin layer.

An aluminum plate or an aluminum alloy plate may advantageously be used as the substrate.

The aluminum plate is first subjected to mechanical surface graining. If desired, the aluminum plate may be subjected to a pretreatment for removing a rolling lubricant from the surface or a pretreatment for exposing a clean aluminum surface with a solvent (e.g., trichloroethylene), a surface active agent or a sodium silicate for the former pretreatment, and with an alkali etching solution of sodium hydroxide, potassium hydroxide, etc. for the latter pretreatment. Mechanical surface graining of an aluminum plate can be carried out by various known methods, for example, sandblasting, ball graining, wire graining and brush graining, with brush graining being preferred. This brush graining method is described in detail in U.S. Pat. No. 3,891,516 (corresponding to JP-B-51-46003) and JP-B-50-40047. Mechanical surface graining is preferably performed to provide an average center-line surface roughness Ra (according to JIS B 0601) of from 0.2 to 1.0 μm. By the mechanical surface graining, the surface of the aluminum plate is provided unevenness at relatively large intervals (primary structure) and fine projections (secondary structure) all over the uneven surface.

The mechanically grained aluminum plate is then chemically etched in order to clear the surface of any remaining abrasive and aluminum dust and to remove the fine projections, to thereby facilitate uniform and effective achievement of subsequent electrochemical surface roughening. The chemical etching is carried out by soaking the aluminum plate in an aqueous solution of an acid or a base capable of dissolving aluminum. For details, reference can be made to U.S. Pat. No. 3,834,998. Suitable acids include sulfuric acid, persulfuric acid and hydrochloric acid, and suitable bases include sodium hydroxide, potassium hydroxide, sodium tertiary phosphate, sodium secondary phosphate, potassium tertiary phosphate, potassium secondary phosphate, sodium aluminate and sodium carbonate. A basic aqueous solution is preferred as an acidic etching solution for its higher etching rate. When chemical etching is effected with a basic aqueous solution, smut is generally produced on the aluminum surface. Thus, the aluminum plate is preferably subjected to desmutting with phosphoric acid, nitric acid, sulfuric acid, chromic acid or a mixed acid containing two or more of these acids.

The thus treated aluminum plate is then electrochemically roughened in an acidic electrolytic solution comprising an aqueous solution of nitric acid, hydrochloric acid, a mixture of nitric acid and hydrochloric acid, and a mixture of these acids and others, such as organic acids, sulfuric acid and phosphoric acid. The electrolytic bath may contain a corrosion inhibitor (or a stabilizer). The electrochemical surface roughening may be conducted in any of a batch system, a semi-continuous system and a continuous system.

After completing the electrolytic surface roughening, the aluminum plate is again subjected to chemical etching with a base. This chemical etching is carried out in the same manner as in the above-described chemical etching using a base. The chemical etching is preferably followed by desmutting with phosphoric acid, nitric acid, sulfuric acid, chromic acid, etc.

The surface roughened aluminum plate is then subjected to anodizing in accordance with well-known procedures. For example, anodizing is carried out in an electrolytic solution comprising an aqueous or non-aqueous solution of sulfuric acid, phosphoric acid, oxalic acid, chromic acid, amidosulfonic acid, a mixture of two or more of these acids, which may contain an $Al^{+3}$ ion, by mainly using a direct current. An alternating current or a combination of a direct current and an alternating current may also be used.

The anodized aluminum plate may further be subjected to a treatment for rendering the surface hydrophilic, for example, by immersing in an aqueous solution of an alkali metal silicate, e.g., sodium silicate, as taught in U.S. Pat. Nos. 2,714,066 and 3,181,461. The silicate treatment is preferably followed by a treatment for further rendering the surface hydrophilic with phosphonic acid.

If desired, an undercoat layer comprising a polymer containing a sulfonic group-containing monomer unit or an undercoat layer comprising a compound containing an —NH$_4$ group, a —COOH group or an —SO$_3$H group may be provided on the aluminum plate.

The resulting aluminum substrate is coated with the photosensitive resin composition of the second aspect of the present invention to prepare the PS plate of the second aspect of the invention, having a photosensitive resin layer. Coating is carried out by means of a bar coater, a foiler, and the like. The coated composition is then dried, for example, at about 80° C. for 4 to 8 minutes. The dry film thickness is generally from 1 to 10 g/m$^2$, preferably from 2 to 4 g/m$^2$. If the dry thickness is less than 1 g/m$^2$, the resulting printing plate is apt to have poor printing durability and poor ink receptivity. If it is more than 10 g/m$^2$, the PS plate is apt to have impractical sensitivity.

If desired, an oxygen-barrier overcoat layer mainly comprising PVA may be provided on the photosensitive resin layer. The PVA preferably has a weight-average molecular weight of 300 to 1,000 and a degree of saponification (i.e., rate of hydrolysis of an acetyl group) of 70 to 90%. For easy coating, PVA is used as diluted with water to a solids content of 5 to 20% by weight. In preparing a PVA aqueous solution, approximately the same amount of silicon dioxide powder as PVA and an adequate amount of a surface active agent, e.g., a nonylphenyl ethylene oxide adduct, are preferably added. The overcoat layer is preferably coated to a dry film thickness of 1 to 2 μm. Coating of the overcoat layer is also carried out by means of a roller coater, a foiler, etc. Drying of the overcoat layer is effected, for example, at about 80° C. for 1 to 3 minutes. Thus, preparation of the PS plate of the second aspect of the present invention is completed.

To produce a PS plate which is to be employed in a direct method using a laser beam of relatively long wavelength and low energy such as one emitted from an argon laser, a titanocene compound represented by the following formula (XI) is added as a photopolymerization initiator to the photosensitive resin composition of the second aspect of the present invention:

(XI)

wherein $R^{11}$ and $R^{12}$ each independently represents an optionally substituted cyclopentadienyl group which may be the same or different; and $R^{13}$ and $R^{14}$ each independently represents an optionally substituted phenyl group which may be the same or is different.

The content of this titanocene compound ranges from 10 to 30% by weight, preferably from 12 to 20% by weight, based on the solids content in the photosensitive resin composition. If the content of the titanocene compound is less than 10% by weight, sufficient sensitivity to laser light having a wavelength within the visible range such as that emitted from an argon laser at 488 nm could not be achieved in some cases. On the other hand, if the content of the titanocene compound exceeds 30% by weight, the strength of the resist pattern is sometimes lowered.

The PS plate having a photosensitive resin layer that has been formed from a photosensitive resin composition that contains the titanocene compound of the kind described above can be exposed with high sensitivity using an argon laser beam of 1 to 3 mJ/cm$^2$ (i.e., direct drawing).

The present invention will now be illustrated in greater detail with reference to the following Examples, but the present invention should not be construed as being limited thereto. All the percents, parts and ratios are by weight unless otherwise indicated.

The following Examples illustrate the first aspect of the present invention.

EXAMPLE 1-1

Figure 2:
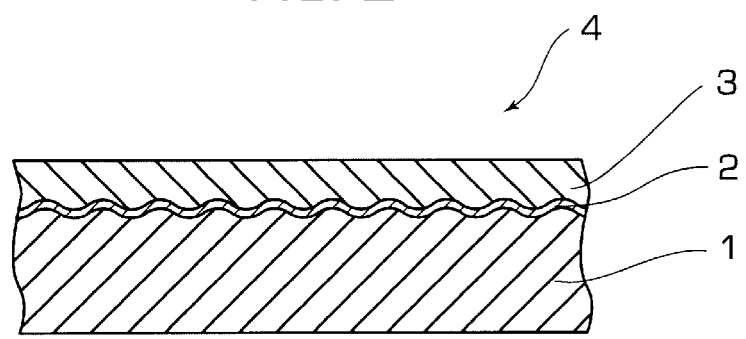

1) Preparation of Aluminum Substrate:

Pretreatment of aluminum plate 1 shown in FIG. 2 was conducted as follows.

The surface of aluminum plate 1 having a thickness of 0.30 mm was grained with a nylon brush and a pumice stone aqueous slurry and thoroughly washed with water. The aluminum plate was soaked in a 10% sodium hydroxide aqueous solution at 70° C. for 60 seconds, washed with running water, neutralized with a 20% nitric acid aqueous solution, and washed with water.

The aluminum plate was then subjected to electrolytic surface roughening in a 1% nitric acid aqueous solution at an anode-hour quantity of electricity of 160 C/dm$^2$ using a sinusoial alternating current at an anode-hour voltage $V_A$ of 12.7 V. The resulting aluminum plate had an Ra of 0.6 μm.

The aluminum plate was soaked in a 30% sulfuric acid aqueous solution at 50° C. for 2 minutes for desmutting and then subjected to anodic oxidation in a 20% sulfuric acid aqueous solution at a current density of 2 A/dm$^2$ for 2 minutes to form oxide layer 2 having a thickness of 2.7 g/m$^2$. Subsequently, the aluminum plate was immersed in a 2.5% sodium silicate aqueous solution at 70° C. for 1 minute, washed with water, and dried to prepare an aluminum substrate.

2) Preparation of Photosensitive Resin Composition:

| | |
|---|---|
| Polymeric binder comprising methylmethacrylate/methacrylic acid/hydroxyphenyl methacrylate/ benzyl methacrylate (50/20/10/20) | 60 parts |
| Pentaerythritol triacrylate | 20 parts |
| Triazine Compound (1) | 2 parts |
| 9-Phenylacridine | 0.2 part |
| Methyl hydroquinone | 0.05 part |
| Ethylene glycol monomethyl ether | 100 parts |
| Methyl ethyl ketone | 60 parts |

The above components were thoroughly kneaded, and the resulting composition was coated on the aluminum substrate to a dry coverage of 2 g/m$^2$ and dried at 100° C. for 2 minutes to obtain PS plate 4 having photosensitive resin layer 3.

3) Preparation of Litho Printing Plate:

PS plate 4 was exposed to 20 mJ/cm$^2$ of ultraviolet light from an ultra-high pressure mercury lamp through a photomask and then immersed in a 0.5% sodium carbonate aqueous solution at 25° C. for 3 minutes to obtain a printing pattern. The resulting pattern did not suffer appreciable loss in film thickness due to corrosion with the developer, and no film was found to remain on the unexposed areas. Finally, the aluminum substrate with the printing pattern on it was rubberized with gum arabic and postcured by exposure to 1 J/cm$^2$ of light from a metal halide lamp to complete a litho printing plate.

The resulting printing plate was mounted on a printing machine and printing was carried out. About 300,000 satisfactory prints were obtained.

EXAMPLE 1-2
1) Preparation of Photosensitive Resin Composition:

| | |
|---|---|
| Polymeric binder described in Example 1-1 | 60 parts |
| Pentaerythritol triacrylate | 20 parts |
| Triazine Compound (2) | 3 parts |
| Titanocene compound (a): | 10 parts |

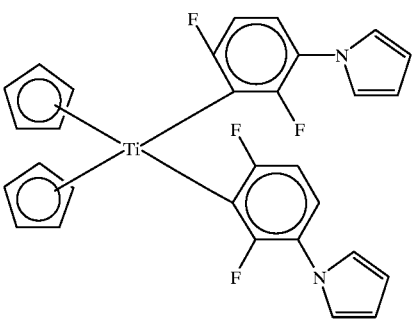

| | |
|---|---|
| 9-Phenylacridine | 3 parts |
| Ethylene glycol monomethyl ether | 100 parts |
| Methyl ethyl ketone | 60 parts |

The above components were thoroughly kneaded to prepare a photosensitive coating composition.

2) Preparation of Litho Printing Plate:

The coating composition was coated on the same aluminum substrate as prepared in Example 1-1 to a dry thickness of 3.5 g/cm$^2$. After drying the coated composition, an aqueous solution containing PVA and silicon dioxide powder (PVA/SiO$_2$/water=7/7/86 by weight) was coated thereon to a dry film thickness of 1.5 g/cm$^2$ to form an overcoat layer for oxygen shielding and for excluding the adverse influences of a standing wave.

The resulting PS plate was imagewise scanned with an argon laser beam of 1 mJ/cm$^2$, and developed and postcured in the same manner as in Example 1-1 to complete a printing plate. The pattern did not suffer appreciable loss in thickness due to corrosion with the developer, and no film was found to remain on the unexposed areas.

The resulting printing plate was mounted on a printing machine and printing was carried out. About 150,000 satisfactory prints were obtained.

EXAMPLE 1-3
1) Preparation of Photosensitive Resin Composition:

| | |
|---|---|
| Partially saponified PVA (degree of polymerization: 500; degree of saponification: 80%) | 100 parts |
| Condensate of dimethylolurea dimethyl ether and N-methylolacrylamide | 60 parts |
| Trimethylolpropane triacrylate | 20 parts |
| Triazine Compound (1) | 5 parts |
| Methyl hydroquinone | 0.05 part |
| Methanol | 50 parts |
| Water | 150 parts |

The above components were thoroughly kneaded to prepare a photosensitive coating composition.

2) Preparation of Letterpress Printing Plate:

The coating composition was coated on a 0.5 mm thick aluminum substrate prepared in the same manner as in Example 1-1 to a dry film thickness of 1 mm and dried at 40° C. for 15 hours to obtain a letterpress printing plate precursor. The precursor was exposed to 700 mJ/cm$^2$ of ultraviolet light through a photomask having a negative pattern, developed with warm water at 45° C. for 2 minutes by means of a spray washer, dried, and postcured at 1 J/cm$^2$ to complete a letterpress printing plate.

When printing was carried out using the resulting printing plate, 300,000 satisfactory prints free from stains on the image areas were obtained.

EXAMPLE 1-4
1) Preparation of Photosensitive Resin Composition:

| | |
|---|---|
| Methyl acrylate/methyl methacrylate/isobutyl methacrylate (25/50/25; weight-average molecular weight: 50,000) | 50 parts |
| Pentaerythritol triacrylate | 15 parts |
| Triazine Compound (1) | 2 parts |
| Methyl hydroquinone | 0.05 part |
| Oil Blue #613 (produced by Orient Chemical Co., ltd.) | 0.02 part |
| Ethyl acetate/methyl ethyl ketone (7/3) | 50 parts |

The above components were kneaded to prepare a photosensitive coating composition.

2) Preparation of Printed Circuit Board:

The coating composition was coated on a copper-clad glass epoxy substrate having a copper foil thickness of 35 μm to a dry film thickness of 50 μm and dried. The resulting cured film was exposed to 100 mJ/cm$^2$ of ultraviolet light through a photomask, and developed with a 1% sodium carbonate aqueous solution at 27° C. for 60 minutes by means of a spray washer to form an etching resist. The resulting resist was free from pattern deficiencies and peeling, and no film was found to remain on the unexposed areas.

The copper surface was then subjected to spray etching with a ferric chloride aqueous solution (specific gravity: 40° Be (Baumédegree)) at 45° C. at a spray pressure of 1.2 kg/cm$^2$ for 60 seconds. After washing with water, the resist film was removed with a 5% sodium hydroxide aqueous solution to provide a copper wiring pattern with high correspondence to the photomask pattern.

As shown in Examples 1-1 to 1-4, the photosensitive resin composition according to the first aspect of the present invention which contains at least one photopolymerization initiator selected from triazine compounds represented by formulae (I) to (V) easily dissolves in a solvent and therefore provides a printing plate such as a PS plate, etc. having high sensitivity and satisfactory developability.

When the triazine compound of the present invention is used in combination with a titanocene compound or an acridine compound, a photosensitive resin composition sensitive to visible light of relatively low energy, such as argon laser light, can be obtained.

EXAMPLE 2-1
1) Preparation of Aluminum Substrate:

A 0.3 mm thick aluminum plate (JIS A-1050 material) was degreased by soaking in a 10% sodium hydroxide aqueous solution at 50° C. for 20 seconds, washed with water, neutralized in a 25% sulfuric acid aqueous solution for 30 seconds, and washed with water. The surface of the aluminum plate was grained with a nylon brush and an aqueous slurry of pumice stone (400 mesh), followed by thoroughly washing with water. The plate was then etched with a 20% sodium hydroxide aqueous solution at 70° C. to dissolve out 10 g/m$^2$ of aluminum, followed by washing with water. The etched aluminum plate was desmutted with a 25% nitric acid aqueous solution and washed with water.

The aluminum plate was then subjected to electrolytic surface roughening in an electrolytic solution containing 15 g/l of nitric acid at 50° C. The plate was further etched with a 1% sodium hydroxide aqueous solution at 70° C. to dissolve out 1 g/m² of aluminum, desmutted by soaking in a 10% sulfuric acid aqueous solution at 50° C. for 2 minutes, and then anodized in a 10% sulfuric acid aqueous solution to form 2.5 g/m² of an oxide layer. The thus treated aluminum plate was immersed in a 2.5% sodium silicate aqueous solution at 80° C. for 1 minute to obtain an aluminum substrate for a PS plate.

2) Preparation of Photosensitive Resin Composition:

| | |
|---|---|
| Methyl methacrylate/methacrylic acid/ hydroxyphenyl methacrylate/benzyl methacrylate (50/20/10/20) | 100 parts |
| Trimethylolpropane triacrylate | 55 parts |
| Titanocene compound (a) described in Example 1–2 | 25 parts |
| Triazine P (triazine compound produced by PANCHIM Co.): | 7 parts |
| 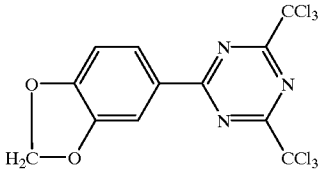 | |
| 9-Phenylacridine | 3 parts |
| Coumarin compound (i) shown above | 2 parts |
| Methyl ethyl ketone/toluene (7/2) | 160 parts |

3) Preparation of Printing Plate:

The photosensitive resin composition was coated on the above-prepared aluminum substrate and dried to form a photosensitive resin layer having a dry thickness of 3.5 g/m². An aqueous solution containing PVA and silicon dioxide powder (PVA/SiO₂/water=7/7/86 by weight) was further coated thereon to a dry film thickness of 1.5 g/cm² to form an overcoat layer for oxygen shielding and for excluding the adverse influence of a standing wave.

The resulting PS plate was imagewise scanned with an argon laser beam of 1 mJ/cm² and developed by immersion in a 0.5% sodium carbonate aqueous solution at 26° C. for 3 minutes. The thus formed printing pattern did not suffer pattern deficiency due to corrosion with the developer, and no residual resist film was found on the unexposed areas. Finally, the surface of the plate was rubberized with gum arabic and postcured by exposure to 1 J/m² of light from a metal halide lamp to complete a printing plate.

EXAMPLE 2-2

A PS plate was prepared in the same manner as in Example 2-1, except for replacing Triazine P of the photosensitive resin composition with Triazine PES (triazine compound produced by PANCHIM Co.) in the same amount. The resulting PS plate was imagewise scanned with 2.5 mJ/cm² of argon laser light and developed in the same manner as in Example 2-1 to obtain a satisfactory printing pattern similar to Example 2-1. The formula of Triazine PES is as follows.

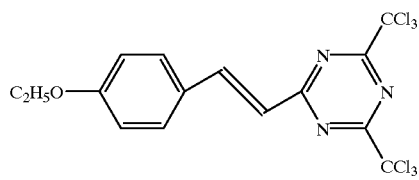

EXAMPLE 2-3

A PS plate was prepared in the same manner as in Example 2-1, except for decreasing the amount of titanocene compound (a) of the photosensitive resin composition to 10 parts. The PS plate was imagewise scanned with 12 mJ/cm² of argon laser light. The resulting pattern suffered a slight loss in thickness but was free from pattern deficiencies or peeling. It is considered that the effects of the present invention would not be produced if less titanocene compound was used.

COMPARATIVE EXAMPLE 2-1

A PS plate was prepared in the same manner as in Example 2-1, except for replacing Triazine P of the photosensitive resin composition with 2,4-bistrichloromethyl-6-(4-styrylphenyl)-s-triazine in the same amount. The PS plate was imagewise scanned with 3.5 mJ/cm² of argon laser light and developed in the same manner as in Example 2-1. The resulting pattern showed a large loss of thickness in the exposed areas, local pattern deficiencies and peeling. Furthermore, residual resist film was observed on parts of the unexposed areas.

As shown in Examples 2-1 to 2-3 and Comparative Example 2-1, the photosensitive resin composition containing, as a photopolymerization initiator, a triazine compound according to the first aspect of the present invention in combination with a titanocene compound exhibits sufficient sensitivity to argon laser light in the visible region of low energy. Since image formation on the PS plate prepared using the photosensitive resin composition can be carried out by imagewise scanning with an argon laser beam, an original film is not needed. Therefore, high precision image formation can be attained, and the number of steps involved in plate making can be reduced.

The following Examples illustrate the second aspect of the present invention.

A. COLOR FILTER

A-1) Preparation of Photosensitive Resin Composition:

Four acridine compounds (A-1, A-2, A-3 and A-4) to be specified below and three triazine compounds (T-1, T-2 and T-3) represented by the following formulae (XII), (VIII) and (XIII) were provided, each as a photopolymerization initiator.

(Acridine compounds)

A-1: 9-phenylacridine.

A-2: 1,7-bis(9-acridinyl)heptane.

A-3: 1,5-bis(9-acridinyl)pentane.

A-4: 1,3-bis(9-acridinyl)propane.

(Triazine compounds)

T-1:

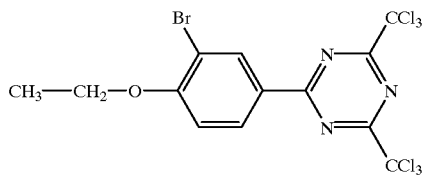

(XII)

T-2:

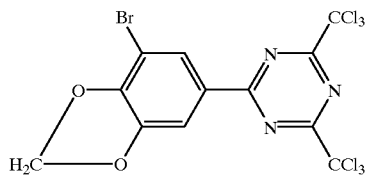

(VIII)

T-3:

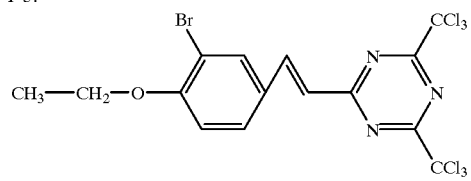

(XIII)

Furthermore, 2-benzyl-2-dimethylamino-1-(4-morpholinophenyl)butane-1-one (IRGACURE 369 of Ciba-Geigy) and 2-(o-chlorophenyl)-4,5-diphenylimidazolyl dimer were provided as additional photopolymerization initiators.

EXAMPLES 3–31 AND COMPARATIVE EXAMPLES 3–7

The above-mentioned photopolymerization initiators were employed in combinations as listed in the following Table 1 and photosensitive resin compositions (Examples 3–31 and Comparative Examples 3–7) each having the composition specified below were prepared. Each photosensitive resin composition was prepared by dispersing and kneading the components in the indicated proportions using a three-roll mill for 2 hours.

TABLE 1

| Photosensitive resin composition | Acridine cpd. | | | | Triazine cpd. | | | | IRGACURE | |
|---|---|---|---|---|---|---|---|---|---|---|
| | A-1 | A-2 | A-3 | A-4 | T-1 | T-2 | T-3 | T-4 | 369 | Dimer |
| Ex. 3 | 1 | — | — | — | 1 | — | — | — | — | — |
| Ex. 4 | 1 | — | — | — | 80 | — | — | — | — | — |
| Ex. 5 | 1 | — | — | — | 15 | — | — | — | — | — |
| Ex. 6 | 1 | — | — | — | 1 | — | — | — | — | — |
| Ex. 7 | 4 | — | — | — | 1 | — | — | — | — | — |
| Ex. 8 | 8 | — | — | — | 1 | — | — | — | — | — |
| Ex. 9 | 1 | — | — | — | 90 | — | — | — | — | — |
| Ex. 10 | 10 | — | — | — | 1 | — | — | — | — | — |
| Ex. 11 | 1 | — | — | — | 1 | — | — | — | — | — |
| Ex. 12 | 1 | — | — | — | 1 | — | — | — | — | — |
| Ex. 13 | 1 | — | — | — | — | 1 | — | — | — | — |
| Ex. 14 | 1 | — | — | — | — | — | 1 | — | — | — |
| Ex. 15 | — | 1 | — | — | 1 | — | — | — | — | — |
| Ex. 16 | — | 1 | — | — | — | 1 | — | — | — | — |
| Ex. 17 | — | 1 | — | — | — | — | 1 | — | — | — |
| Ex. 18 | — | — | 1 | — | 1 | — | — | — | — | — |
| Ex. 19 | — | — | 1 | — | — | 1 | — | — | — | — |
| Ex. 20 | — | — | 1 | — | — | — | 1 | — | — | — |
| Ex. 21 | — | — | — | 1 | 1 | — | — | — | — | — |
| Ex. 22 | — | — | — | 1 | — | 1 | — | — | — | — |
| Ex. 23 | — | — | — | 1 | — | — | 1 | — | — | — |
| Ex. 24 | 4 | — | — | — | 4 | — | — | — | 2 | — |
| Ex. 25 | 4 | — | — | — | — | 5 | — | — | 2 | — |
| Ex. 26 | 5 | — | — | — | — | — | 4 | — | 2 | — |
| Ex. 27 | — | 4 | — | — | 4 | — | — | — | 2 | — |
| Ex. 28 | — | — | 4 | — | 4 | — | — | — | 2 | — |
| Ex. 29 | — | — | — | 4 | 4 | — | — | — | 2 | — |
| Ex. 30 | 4 | — | — | — | 4 | — | — | — | 2 | 1 |
| C. Ex. 3 | — | — | — | — | 5 | — | — | — | 3 | — |
| C. Ex. 4 | — | — | — | — | — | 5 | — | — | 3 | — |
| C. Ex. 5 | — | — | — | — | — | — | 5 | — | 3 | — |
| C. Ex. 6 | 5 | — | — | — | — | — | — | — | 3 | — |
| C. Ex. 7 | 4 | — | — | — | — | — | — | 3 | 2 | — |

*Each value in the Table refers to the proportion by weight of the indicated photopolymerization initiator component.

EXAMPLE 3

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 4 |
| Triazine compound (T-1) | 4 |
| 3-methoxybutyl acetate | 135 |

(the content of photopolymerization initiators per 100 parts by weight of the solids content in photosensitive resin composition: 17.8 parts by weight).

EXAMPLE 4

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 0.125 |
| Triazine compound (T-1) | 10 |
| 3-methoxybutyl acetate | 135 |

(the content of photopolymerization initiators per 100 parts by weight of the solids content in photosensitive resin composition: 21.5 parts by weight).

EXAMPLE 5

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 0.6 |
| Triazine compound (T-1) | 9 |
| 3-methoxybutyl acetate | 135 |

(the content of photopolymerization initiators per 100 parts by weight of the solids content in photosensitive resin composition: 20.6 parts by weight).

EXAMPLE 6

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 15 |
| Acridine compound (A-1) | 1 |
| Triazine compound (T-1) | 1 |
| 3-methoxybutyl acetate | 135 |

(the content of photopolymerization initiators per 100 parts by weight of the solids content in photosensitive resin composition: 4.8 parts by weight).

EXAMPLE 7

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 8 |
| Triazine compound (T-1) | 2 |
| 3-methoxybutyl acetate | 135 |

(the content of photopolymerization initiators per 100 parts by weight of the solids content in photosensitive resin composition: 21.3 parts by weight).

EXAMPLE 8

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 10 |
| Triazine compound (T-1) | 1.25 |
| 3-methoxybutyl acetate | 135 |

(the content of photopolymerization initiators per 100 parts by weight of the solids content in photosensitive resin composition: 23.3 parts by weight).

EXAMPLE 9

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 12 |
| Acridine compound (A-1) | 0.2 |
| Triazine compound (T-1) | 18 |
| 3-methoxybutyl acetate | 135 |

(the content of photopolymerization initiators per 100 parts by weight of the solids content in photosensitive resin composition: 33 parts by weight).

EXAMPLE 10

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 15 |
| Acridine compound (A-1) | 10 |
| Triazine compound (T-1) | 1 |
| 3-methoxybutyl acetate | 135 |

(the content of photopolymerization initiators per 100 parts by weight of the solids content in photosensitive resin composition: 22.9 parts by weight).

EXAMPLE 11

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 15 |
| Acridine compound (A-1) | 0.2 |
| Triazine compound (T-1) | 0.2 |
| 3-methoxybutyl acetate | 135 |

(the content of photopolymerization initiators per 100 parts by weight of the solids content in photosensitive resin composition: 0.99 parts by weight).

EXAMPLE 12

| | parts by weight |
|---|---|
| FASTGEN BLUE GS (Dainippon Ink and Chemicals, Inc.) | 10 |
| Methacrylic acid/methyl methacrylate copolymer (25/75 by wt. %, weight-average molecular weight: ca 25,000) | 15 |
| Trimethylolpropane triacrylate | 10 |
| Acridine compound (A-1) | 12 |
| Triazine compound (T-1) | 12 |
| 3-methoxybutyl acetate | 135 |

(the content of photopolymerization initiators per 100 parts by weight of the solids content in photosensitive resin composition: 40.7 parts by weight).

EXAMPLE 13

A photosensitive resin composition was prepared by repeating the procedure of Example 3 except that triazine compound (T-2) was used instead of triazine compound (T-1).

EXAMPLE 14

A photosensitive resin composition was prepared by repeating the procedure of Example 3 except that triazine compound (T-3) was used instead of triazine compound (T-1).

EXAMPLE 15

A photosensitive resin composition was prepared by repeating the procedure of Example 3 except that acridine compound (A-2) was used instead of acridine compound (A-1).

EXAMPLE 16

A photosensitive resin composition was prepared by repeating the procedure of Example 3 except that acridine compound (A-2) and triazine compound (T-2) were used instead of acridine compound (A-1) and triazine compound (T-1), respectively.

EXAMPLE 17

A photosensitive resin composition was prepared by repeating the procedure of Example 3 except that acridine compound (A-2) and triazine compound (T-3) were used instead of acridine compound (A-1) and triazine compound (T-1), respectively.

EXAMPLE 18

A photosensitive resin composition was prepared by repeating the procedure of Example 3 except that acridine compound (A-3) was used instead of acridine compound (A-1).

EXAMPLE 19

A photosensitive resin composition was prepared by repeating the procedure of Example 3 except that acridine compound (A-3) and triazine compound (T-2) were used instead of acridine compound (A-1) and triazine compound (T-1), respectively.

EXAMPLE 20

A photosensitive resin composition was prepared by repeating the procedure of Example 3 except that acridine compound (A-3) and triazine compound (T-3) were used instead of acridine compound (A-1) and triazine compound (T-1), respectively.

EXAMPLE 21

A photosensitive resin composition was prepared by repeating the procedure of Example 3 except that acridine compound (A-4) was used instead of acridine compound (A-1).

EXAMPLE 22

A photosensitive resin composition was prepared by repeating the procedure of Example 3 except that acridine compound (A-4) and triazine compound (T-2) were used instead of acridine compound (A-1) and triazine compound (T-1), respectively.

EXAMPLE 23

A photosensitive resin composition was prepared by repeating the procedure of Example 3 except that acridine compound (A-4) and triazine compound (T-3) were used instead of acridine compound (A-1) and triazine compound (T-1), respectively.

EXAMPLE 24

| | parts by weight |
|---|---|
| FASTGEN BLUE GS (Dainippon Ink and Chemicals, Inc.) | 20 |
| Methacrylic acid/methyl methacrylate copolymer (25/75 by wt. %, weight-average molecular weight: ca 25,000) | 15 |
| Trimethylolpropane triacrylate | 9 |
| 2-benzyl-2-dimethylamino-1-(4-morpholino-phenyl)butane-1-one (IRGACURE 369 of Ciba-Geigy) | 2 |
| Acridine compound (A-1) | 4 |
| Triazine compound (T-1) | 4 |
| 3-methoxybutyl acetate | 135 |

(the content of photopolymerization initiators per 100 parts by weight of the solids content in photosensitive resin composition: 18.5 parts by weight).

EXAMPLE 25

| | parts by weight |
|---|---|
| CHROMOPHTHAL RED A2B (Ciba-Geigy) | 20 |
| Methacrylic acid/benzyl methacrylate copolymer (25/75 by wt. %, weight-average molecular weight: ca 30,000) | 15 |
| Pentaerythritol tetraacrylate | 9 |
| 2-benzyl-2-dimethylamino-1-(4-morpholinophenyl)butane-1-one (IRGACURE 369 of Ciba-Geigy) | 2 |
| Acridine compound (A-1) | 4 |
| Triazine compound (T-2) | 5 |
| Ethylene glycol monomethyl ether | 100 |
| 3-methoxybutyl acetate | 50 |

(the content of photopolymerization initiators per 100 parts by weight of the solids content in photosensitive resin composition: 20.3 parts by weight).

EXAMPLE 26

| | parts by weight |
|---|---|
| LYONOL GREEN 2Y-301 (Tokyo Ink Mfg., Co., Ltd.) | 20 |
| Methacrylic acid/benzyl methacrylate copolymer (25/75 by wt. %, weight-average molecular weight: ca 30,000) | 15 |
| Pentaerythritol tetraacrylate | 9 |
| 2-benzyl-2-dimethylamino-1-(4-morpholinophenyl)butane-1-one (IRGACURE 369 of Ciba-Geigy) | 2 |
| Acridine compound (A-1) | 5 |
| Triazine compound (T-3) | 4 |
| 3-methyl-3-methoxybutyl acetate | 100 |
| Ethylene glycol monomethyl ether | 50 |

(the content of photopolymerization initiators per 100 parts by weight of the solids content in photosensitive resin composition: 20.0 parts by weight).

EXAMPLE 27

A photosensitive resin composition was prepared by repeating the procedure of Example 24 except that acridine compound (A-2) was used instead of acridine compound (A-1).

EXAMPLE 28

A photosensitive resin composition was prepared by repeating the procedure of Example 24 except that acridine compound (A-3) was used instead of acridine compound (A-1).

EXAMPLE 29

A photosensitive resin composition was prepared by repeating the procedure of Example 24 except that acridine compound (A-4) was used instead of acridine compound (A-1).

EXAMPLE 30

A photosensitive resin composition was prepared by repeating the procedure of Example 24 except that 1 part by weight of 2-(o-chlorophenyl)-4,5-diphenylimidazolyl dimer was added as a photopolymerization initiator.

COMPARATIVE EXAMPLE 3

A photosensitive resin composition was prepared by repeating the procedure of Example 24 except that the amounts of 2-benzyl-2-dimethylamino-1-(4-morpholinophenyl)butane-1-one (IRGACURE 369 of Ciba-Geigy) and triazine compound (T-1) were increased to 3 and 5 parts by weight, respectively, but that acridine compound (A-1) was not added.

COMPARATIVE EXAMPLE 4

A photosensitive resin composition was prepared by repeating the procedure of Example 25 except that the amounts of 2-benzyl-2-dimethylamino-1-(4-morpholinophenyl)butane-1-one (IRGACURE 369 of Ciba-Geigy) and triazine compound (T-2) were increased to 3 and 5 parts by weight, respectively, but that acridine compound (A-1) was not added.

COMPARATIVE EXAMPLE 5

A photosensitive resin composition was prepared by repeating the procedure of Example 26 except that the amounts of 2-benzyl-2-dimethylamino-1-(4-morpholinophenyl)butane-1-one (IRGACURE 369 of Ciba-Geigy) and triazine compound (T-3) were increased to 3 and 5 parts by weight, respectively, but that acridine compound (A-1) was not added.

COMPARATIVE EXAMPLE 6

A photosensitive resin composition was prepared by repeating the procedure of Example 26 except that the amounts of 2-benzyl-2-dimethylamino-1-(4-morpholinophenyl)butane-1-one (IRGACURE 369 of Ciba-Geigy) and acridine compound (A-1) were increased to 3 and 5 parts by weight, respectively, but that triazine compound (T-3) was not added.

COMPARATIVE EXAMPLE 7

A photosensitive resin composition was prepared by repeating the procedure of Example 24 except that 3 parts by weight of 1,3-di-(trichloromethyl)-s-triazine (T-4) was used instead of triazine compound (T-1).

A-2) Preparation of Color Filter:

Each of the photosensitive resin composition prepared in Examples 3–30 and Comparative Examples 3–7 was applied onto a 3-mm thick glass substrate having a clean surface by means of a spin coater (TR 25000 of Tokyo Ohka Kogyo Co., Ltd.) to provide a dry film thickness of 2 μm and then dried at 80° C. for 1 minute. Next, it was exposed to UV radiation through a mask that was capable of reproducing 20-μm width lines and 80 μm space patterns in six radiation doses (i.e., 50, 70, 100, 150, 200 and 400 mJ/cm$^2$). Then, spray development was carried out by dipping the irradiated substrate in a 0.5% aqueous solution of sodium carbonate at 25° C. for five development periods (i.e., 60, 90, 120, 150 and 180 seconds). The exposed and unexposed areas of the color filter layers thus prepared were evaluated on the basis of the following criteria. The results are given in Tables 2-1 to 2-5.

◎: Exposed areas experienced neither peeling nor chipping and unexposed areas had no residue.

○: Exposed areas experienced neither peeling nor chipping and unexposed areas had no residue; however, some loss in coating was observed.

Δ: Exposed areas experienced extensive loss in coating and some peeling or chipping. Unexposed areas had some residue.

x: Exposed areas mostly dissolved out by means of the liquid developer, making the sample unsuitable for use as a color filter.

TABLE 2-1

| Photosensitive resin composition | Development time (sec.) | Irradiation energy (mJ/cm$^2$) 50 | 70 | 100 | 150 | 200 | 400 |
|---|---|---|---|---|---|---|---|
| Ex. 3 | 60 | ○ | ◎ | ◎ | ◎ | ◎ | ◎ |
|  | 90 | ○ | ◎ | ◎ | ◎ | ◎ | ◎ |
|  | 120 | ○ | ◎ | ◎ | ◎ | ◎ | ◎ |
|  | 150 | △ | ○ | ○ | ◎ | ◎ | ◎ |
|  | 180 | △ | ○ | ○ | ○ | ◎ | ◎ |
| Ex. 4 | 60 | ○ | ◎ | ◎ | ◎ | ◎ | ◎ |
|  | 90 | △ | ○ | ◎ | ◎ | ◎ | ◎ |
|  | 120 | △ | ○ | ○ | ◎ | ◎ | ◎ |
|  | 150 | △ | △ | ○ | ○ | ◎ | ◎ |
|  | 180 | △ | △ | ○ | ○ | ◎ | ◎ |
| Ex. 5 | 60 | ○ | ◎ | ◎ | ◎ | ◎ | ◎ |
|  | 90 | ○ | ◎ | ◎ | ◎ | ◎ | ◎ |
|  | 120 | △ | ○ | ◎ | ◎ | ◎ | ◎ |
|  | 150 | △ | △ | ○ | ◎ | ◎ | ◎ |
|  | 180 | △ | △ | ○ | ○ | ◎ | ◎ |
| Ex. 6 | 60 | ○ | ◎ | ◎ | ◎ | ◎ | ◎ |
|  | 90 | ○ | ◎ | ◎ | ◎ | ◎ | ◎ |
|  | 120 | ○ | ◎ | ◎ | ◎ | ◎ | ◎ |
|  | 150 | △ | ○ | ◎ | ◎ | ◎ | ◎ |
|  | 180 | △ | ○ | ○ | ○ | ◎ | ◎ |
| Ex. 7 | 60 | ○ | ◎ | ◎ | ◎ | ◎ | ◎ |
|  | 90 | ○ | ◎ | ◎ | ◎ | ◎ | ◎ |
|  | 120 | △ | ○ | ◎ | ◎ | ◎ | ◎ |
|  | 150 | △ | ○ | ○ | ◎ | ◎ | ◎ |
|  | 180 | △ | △ | ○ | ○ | ◎ | ◎ |
| Ex. 8 | 60 | ○ | ◎ | ◎ | ◎ | ◎ | ◎ |
|  | 90 | ○ | ◎ | ◎ | ◎ | ◎ | ◎ |
|  | 120 | △ | ○ | ◎ | ◎ | ◎ | ◎ |
|  | 150 | △ | ○ | ○ | ◎ | ◎ | ◎ |
|  | 180 | △ | △ | ○ | ○ | ◎ | ◎ |
| Ex. 9 | 60 | △ | ◎ | ◎ | ◎ | ◎ | ◎ |
|  | 90 | △ | ○ | ◎ | ◎ | ◎ | ◎ |
|  | 120 | △ | ○ | ◎ | ◎ | ◎ | ◎ |
|  | 150 | X | △ | ○ | ◎ | ◎ | ◎ |
|  | 180 | X | △ | △ | ○ | ○ | ◎ |
| Ex. 10 | 60 | △ | ◎ | ◎ | ◎ | ◎ | ◎ |
|  | 90 | △ | ○ | ◎ | ◎ | ◎ | ◎ |
|  | 120 | X | ○ | ◎ | ◎ | ◎ | ◎ |
|  | 150 | X | △ | ○ | ○ | ◎ | ◎ |
|  | 180 | X | △ | △ | ○ | ○ | ◎ |

TABLE 2-2

| Photosensitive resin composition | Development time (sec.) | Irradiation energy (mJ/cm$^2$) 50 | 70 | 100 | 150 | 200 | 400 |
|---|---|---|---|---|---|---|---|
| Ex. 11 | 60 | △ | ○ | ◎ | ◎ | ◎ | ◎ |
|  | 90 | △ | ○ | ◎ | ◎ | ◎ | ◎ |
|  | 120 | X | ○ | ○ | ◎ | ◎ | ◎ |
|  | 150 | X | △ | ○ | ◎ | ◎ | ◎ |
|  | 180 | X | X | △ | ○ | ○ | ○ |
| Ex. 12 | 60 | ○ | ◎ | ◎ | ◎ | ◎ | ◎ |
|  | 90 | ○ | ◎ | ◎ | ◎ | ◎ | ◎ |
|  | 120 | △ | ○ | ○ | ◎ | ◎ | ◎ |
|  | 150 | △ | △ | △ | ○ | ◎ | ◎ |
|  | 180 | X | △ | △ | ○ | ○ | ○ |
| Ex. 13 | 60 | ○ | ◎ | ◎ | ◎ | ◎ | ◎ |
|  | 90 | ○ | ◎ | ◎ | ◎ | ◎ | ◎ |
|  | 120 | ○ | ◎ | ◎ | ◎ | ◎ | ◎ |
|  | 150 | △ | ○ | ○ | ◎ | ◎ | ◎ |
|  | 180 | △ | △ | ○ | ○ | ○ | ◎ |
| Ex. 14 | 60 | ○ | ◎ | ◎ | ◎ | ◎ | ◎ |
|  | 90 | ○ | ◎ | ◎ | ◎ | ◎ | ◎ |
|  | 120 | ○ | ○ | ◎ | ◎ | ◎ | ◎ |
|  | 150 | △ | ○ | ○ | ◎ | ◎ | ◎ |
|  | 180 | △ | △ | ○ | ○ | ○ | ◎ |
| Ex. 15 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |

TABLE 2-2-continued

| Photosensitive resin composition | Development time (sec.) | Irradiation energy (mJ/cm$^2$) 50 | 70 | 100 | 150 | 200 | 400 |
|---|---|---|---|---|---|---|---|
|  | 150 | △ | ○ | ○ | ◎ | ◎ | ◎ |
|  | 180 | △ | ○ | ○ | ○ | ○ | ◎ |
| Ex. 16 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ○ | ◎ | ◎ | ◎ |
|  | 180 | △ | △ | ○ | ○ | ○ | ◎ |
| Ex. 17 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ○ | ◎ | ◎ | ◎ |
|  | 180 | △ | △ | ○ | ○ | ○ | ◎ |
| Ex. 18 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ○ | ◎ | ◎ | ◎ |
|  | 180 | △ | △ | ○ | ○ | ○ | ◎ |

TABLE 2-3

| Photosensitive resin composition | Development time (sec.) | Irradiation energy (mJ/cm$^2$) 50 | 70 | 100 | 150 | 200 | 400 |
|---|---|---|---|---|---|---|---|
| Ex. 19 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ○ | ◎ | ◎ | ◎ |
|  | 180 | △ | △ | ○ | ○ | ○ | ◎ |
| Ex. 20 | 60 | ◎ | ◎ | ◎ | ◎ | ◎ | ◎ |
|  | 90 | ○ | ◎ | ◎ | ◎ | ◎ | ◎ |
|  | 120 | △ | ○ | ◎ | ◎ | ◎ | ◎ |
|  | 150 | △ | △ | ○ | ◎ | ◎ | ◎ |
|  | 180 | △ | △ | ○ | ○ | ○ | ◎ |
| Ex. 21 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ○ | ◎ | ◎ | ◎ |
|  | 180 | △ | ○ | ○ | ○ | ○ | ◎ |
| Ex. 22 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | ○ | ◎ | ◎ | ◎ | ◎ |
|  | 180 | △ | △ | ○ | ○ | ○ | ◎ |
| Ex. 23 | 60 | ○ | ◎ | ◎ | ◎ | ◎ | ◎ |
|  | 90 | ○ | ◎ | ◎ | ◎ | ◎ | ◎ |
|  | 120 | △ | ◎ | ◎ | ◎ | ◎ | ◎ |
|  | 150 | △ | △ | ○ | ◎ | ◎ | ◎ |
|  | 180 | △ | △ | ○ | ○ | ○ | ◎ |
| Ex. 24 | 60 | ◎ | ◎ | ◎ | ◎ | ◎ | ◎ |
|  | 90 | ◎ | ◎ | ◎ | ◎ | ◎ | ◎ |
|  | 120 | ◎ | ◎ | ◎ | ◎ | ◎ | ◎ |
|  | 150 | ○ | ○ | ◎ | ◎ | ◎ | ◎ |
|  | 180 | △ | ○ | ○ | ◎ | ◎ | ◎ |
| Ex. 25 | 60 | ◎ | ◎ | ◎ | ◎ | ◎ | ◎ |
|  | 90 | ◎ | ◎ | ◎ | ◎ | ◎ | ◎ |
|  | 120 | ◎ | ◎ | ◎ | ◎ | ◎ | ◎ |
|  | 150 | ○ | ○ | ◎ | ◎ | ◎ | ◎ |
|  | 180 | △ | ○ | ○ | ◎ | ◎ | ◎ |
| Ex. 26 | 60 | ◎ | ◎ | ◎ | ◎ | ◎ | ◎ |
|  | 90 | ◎ | ◎ | ◎ | ◎ | ◎ | ◎ |
|  | 120 | ◎ | ◎ | ◎ | ◎ | ◎ | ◎ |
|  | 150 | ○ | ○ | ◎ | ◎ | ◎ | ◎ |
|  | 180 | △ | △ | ○ | ○ | ◎ | ◎ |

TABLE 2-4

| Photosensitive resin composition | Development time (sec.) | Conditions of color filter layer preparation Irradiation energy (mJ/cm$^2$) | | | | | |
|---|---|---|---|---|---|---|---|
| | | 50 | 70 | 100 | 150 | 200 | 400 |
| Ex. 27 | 60 | ⊚ | ⊚ | ⊚ | ⊚ | ⊚ | ⊚ |
| | 90 | ⊚ | ⊚ | ⊚ | ⊚ | ⊚ | ⊚ |
| | 120 | ⊚ | ⊚ | ⊚ | ⊚ | ⊚ | ⊚ |
| | 150 | ○ | ○ | ⊚ | ⊚ | ⊚ | ⊚ |
| | 180 | Δ | ○ | ⊚ | ⊚ | ⊚ | ⊚ |
| Ex. 28 | 60 | ⊚ | ⊚ | ⊚ | ⊚ | ⊚ | ⊚ |
| | 90 | ⊚ | ⊚ | ⊚ | ⊚ | ⊚ | ⊚ |
| | 120 | ○ | ⊚ | ⊚ | ⊚ | ⊚ | ⊚ |
| | 150 | Δ | ⊚ | ⊚ | ⊚ | ⊚ | ⊚ |
| | 180 | Δ | ○ | ○ | ⊚ | ⊚ | ⊚ |
| Ex. 29 | 60 | ⊚ | ⊚ | ⊚ | ⊚ | ⊚ | ⊚ |
| | 90 | ⊚ | ⊚ | ⊚ | ⊚ | ⊚ | ⊚ |
| | 120 | ○ | ⊚ | ⊚ | ⊚ | ⊚ | ⊚ |
| | 150 | Δ | ○ | ⊚ | ⊚ | ⊚ | ⊚ |
| | 180 | Δ | ○ | ○ | ⊚ | ⊚ | ⊚ |
| Ex. 30 | 60 | ⊚ | ⊚ | ⊚ | ⊚ | ⊚ | ⊚ |
| | 90 | ⊚ | ⊚ | ⊚ | ⊚ | ⊚ | ⊚ |
| | 120 | ⊚ | ⊚ | ⊚ | ⊚ | ⊚ | ⊚ |
| | 150 | ⊚ | ⊚ | ⊚ | ⊚ | ⊚ | ⊚ |
| | 180 | ⊚ | ⊚ | ⊚ | ⊚ | ⊚ | ⊚ |

TABLE 2-5

| Photosensitive resin composition | Development time (sec.) | Conditions of color filter layer preparation Irradiation energy (mJ/cm$^2$) | | | | | |
|---|---|---|---|---|---|---|---|
| | | 50 | 70 | 100 | 150 | 200 | 400 |
| C. Ex. 3 | 60 | X | X | Δ | ⊚ | ⊚ | ⊚ |
| | 90 | X | X | Δ | ○ | ⊚ | ⊚ |
| | 120 | X | X | X | ○ | ⊚ | ⊚ |
| | 150 | X | X | X | Δ | ○ | ○ |
| | 180 | X | X | X | X | ○ | ○ |
| C. Ex. 4 | 60 | X | X | Δ | ⊚ | ⊚ | ⊚ |
| | 90 | X | X | Δ | ○ | ⊚ | ⊚ |
| | 120 | X | X | X | ○ | ○ | ⊚ |
| | 150 | X | X | X | Δ | ○ | ○ |
| | 180 | X | X | X | X | ○ | ○ |
| C. Ex. 5 | 60 | X | X | Δ | ⊚ | ⊚ | ⊚ |
| | 90 | X | X | Δ | ○ | ⊚ | ⊚ |
| | 120 | X | X | X | Δ | ⊚ | ⊚ |
| | 150 | X | X | X | Δ | ○ | ○ |
| | 180 | X | X | X | X | ○ | ○ |
| C. Ex. 6 | 60 | X | Δ | Δ | ⊚ | ⊚ | ⊚ |
| | 90 | X | X | Δ | ○ | ⊚ | ⊚ |
| | 120 | X | X | X | ○ | ⊚ | ⊚ |
| | 150 | X | X | X | Δ | ○ | ○ |
| | 180 | X | X | X | X | ○ | ○ |
| C. Ex. 7 | 60 | X | Δ | Δ | ○ | ⊚ | ⊚ |
| | 90 | X | X | Δ | ○ | ⊚ | ⊚ |
| | 120 | X | X | Δ | ○ | ○ | ⊚ |
| | 150 | X | X | X | Δ | ○ | ○ |
| | 180 | X | X | X | X | ○ | ○ |

As Tables 2-1 to 2-5 show, the photosensitive resin compositions of the present invention had high sensitivity. By using them in the production of color filters by the pigment dispersion method, color filters having high resolution could be produced. Furthermore, they achieved a large development margin.

A comparison of Examples 3 to 10 definitely shows that the photosensitive resin compositions with compounding weight ratios of the acridine compound to the triazine compound falling within the range from 1:80 to 8:1 (i.e., Examples 3 to 8), in particular, from 1:10 to 2:1 (i.e., Examples 3 and 6) are preferred. A comparison of Examples 3 to 8, 11 and 12 further shows that the preferred content of the photopolymerization initiators is from 1 to 40 parts by weight per 100 parts by weight of the photosensitive resin composition.

The photosensitive resin composition of the second aspect of the present invention may also be employed with advantage as a light-shielding filter such as a black matrix.

EXAMPLE 31

| | parts by weight |
|---|---|
| CHROMOPHTHAL YELLOW A2R (Ciba-Geigy) | 6 |
| N,N'-bis-(2-phenylethyl)perylene-3,4,9,10-bis-(dicarboxyimide) | 7 |
| Carbon black | 7 |
| Methacrylic acid/benzyl methacrylate copolymer (25/75 by wt. %, weight-average molecular weight: ca 30,000) | 15 |
| Pentaerythritol tetraacrylate | 9 |
| 2-benzyl-2-dimethylamino-1-(4-morpholino-phenyl)butane-1-one (IRGACURE 369 of Ciba-Geigy) | 3 |
| Acridine compound (A-1) | 6 |
| Triazine compound (T-1) | 8 |
| 3-methoxybutyl acetate | 135 |

(the content of photopolymerization initiators per 100 parts by weight of the solids content in photosensitive resin composition: 27.9 parts by weight)

As in Examples 3 to 30, a photosensitive resin composition having the above-mentioned composition was applied onto a glass substrate, dried and exposed to UV radiation at a dose of 400 mJ/cm$^2$ through a mask capable of reproducing 20-μm width lines and 80 μm space patterns. Next, development was conducted in a 0.5% aqueous solution of sodium carbonate at 25° C. for 60 seconds. The light-shielding filter layer thus obtained was excellent in that it experienced neither peeling nor chipping in the exposed areas and that it had no residue in the unexposed areas.

B. PS PLATE

B-1) Preparation of Substrate for PS Plate:

A 0.3 mm thick aluminum plate (JIS A-1050 material) was degreased by soaking in a 10% sodium hydroxide aqueous solution at 50° C. for 20 seconds, washed with water, neutralized in a 25% sulfuric acid aqueous solution for 30 seconds, and washed with water. The surface of the aluminum plate was grained with a nylon brush and an aqueous slurry of pumice stone (400 mesh), followed by thoroughly washing with water. The plate was then etched with a 20% sodium hydroxide aqueous solution at 70° C. to dissolve out 10 g/m$^2$ of aluminum, followed by washing with water. The etched aluminum plate was desmutted with a 25% nitric acid aqueous solution and washed with water.

The aluminum plate was then subjected to electrolytic surface roughening in an electrolytic solution containing 15 g/l of nitric acid at 50° C. The plate was further etched with a 1% sodium hydroxide aqueous solution at 70° C. to dissolve out 1 g/m$^2$ of aluminum, desmutted by soaking in a 10% sulfuric acid aqueous solution at 50° C. for 2 minutes, and then anodized in a 10% sulfuric acid aqueous solution to form 2.5 g/m$^2$ of an oxide layer. The thus treated aluminum plate was immersed in a 2.5% sodium silicate aqueous solution at 80° C. for 1 minute to obtain an aluminum substrate for a PS plate.

B-2) Preparation of Photosensitive Resin Composition:

An acridine compound (9-phenylacridine), a triazine compound represented by the following formula (XII), a titanocene compound represented by the following formula (XIV) and 2-benzyl-2-dimethylamino-1-(4-morpholinophenyl)butane-1-one (IRGACURE 369 of Ciba-Geigy) were provided as photopolymerization initiators.

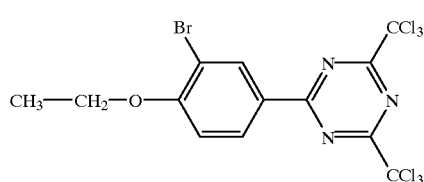

(XII)

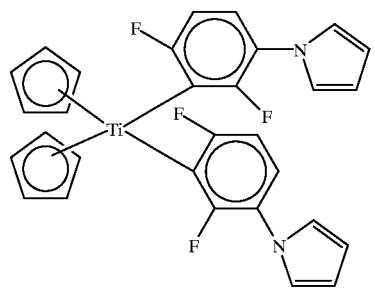

(XIV)

EXAMPLES I–IV AND COMPARATIVE EXAMPLE I

The above-mentioned photopolymerization initiators were employed in combinations, and photosensitive resin compositions (Examples I–IV and Comparative Example I) having the formulations specified below were prepared. Each photosensitive resin composition was prepared by dispersing and kneading the components in the indicated proportions using a three-roll mill for 2 hours.

EXAMPLE I

| | parts by weight |
|---|---|
| Polymeric binder composed of methyl methacrylate/methacrylic acid/hydroxyphenyl methacrylate/benzyl methacrylate = 50/20/10/20 (by wt.) | 60 |
| Diethylene glycol diacrylate | 10 |
| Pentaerythritol triacrylate | 10 |
| Acridine (A-1) | 0.4 |
| Triazine (T-1) | 2 |
| Solvent comprising ethylene glycol monomethyl ether/methyl ethyl/ketone = 5/3 (by wt.) | 180 |

EXAMPLE II

| | parts by weight |
|---|---|
| Polymeric binder composed of methyl methacrylate/methacrylic acid/hydroxyphenyl methacrylate/benzyl methacrylate = 50/20/10/20 (by wt.) | 60 |
| Diethylene glycol diacrylate | 10 |
| Pentaerythritol triacrylate | 10 |
| Acridine (A-1) | 0.4 |
| Triazine (T-1) | 2 |
| 2-benzyl-2-dimethylamino-1-(4-morpholinophenyl)butane-1-one (IRGACURE 369 of Ciba-Geigy) | 1 |
| Solvent comprising ethylene glycol monomethyl ether/methyl ethyl/ketone = 5/3 (by wt.) | 180 |

EXAMPLE III

| | parts by weight |
|---|---|
| Polymeric binder composed of methyl methacrylate/methacrylic acid/hydroxyphenyl methacrylate/benzyl methacrylate = 50/20/10/20 (by wt.) | 60 |
| Diethylene glycol diacrylate | 10 |
| Trimethylolpropane triacrylate | 10 |
| Acridine (A-1) | 3 |
| Triazine (T-1) | 3 |
| Titanocene (represented hereinabove by Chemical formula (XIV)) | 10 |
| Solvent comprising ethylene glycol monomethyl ether/methyl ethyl/ketone = 5/3 (by wt.) | 180 |

EXAMPLE IV

| | parts by weight |
|---|---|
| Polymeric binder composed of methyl methacrylate/methacrylic acid/hydroxyphenyl methacrylate/benzyl methacrylate = 50/20/10/20 (by wt.) | 60 |
| Diethylene glycol diacrylate | 10 |
| Pentaerythritol triacrylate | 10 |
| Acridine (A-1) | 3 |
| Triazine (T-1) | 3 |
| Titanocene (represented hereinabove by Chemical formula (XIV)) | 10 |
| 2-benzyl-2-dimethylamino-1-(4-morpholinophenyl)butane-1-one (IRGACURE 369 of Ciba-Geigy) | 1 |
| Solvent comprising ethylene glycol monomethyl ether/methyl ethyl/ketone = 5/3 (by wt.) | 180 |

COMPARATIVE EXAMPLE I

A photosensitive resin composition was prepared by repeating the procedure of Example I except that 3 parts by weight of 1,3-di-(trichloromethyl)-s-triazine was used instead of the triazine compound employed in Example I.

COMPARATIVE EXAMPLE II

A photosensitive resin composition was prepared by repeating the procedure of Example III except that 3 parts by weight of 1,3-di-(trichloromethyl)-s-triazine was used instead of the triazine compound employed in Example III.

B-3) Preparation of PS Plate:

Each of these photosensitive resin compositions (Examples I–III and Comparative Examples I–II) was applied onto the separately prepared substrate for a PS plate by the roll coating method and dried to form a photosensitive resin layer (dry thickness: 3.5 g/m$^2$). An aqueous solution containing PVA and silicon dioxide powder (PVA/SiO$_2$/water=7/7/86 by weight) was further coated thereon to a dry film thickness of 1.5 g/cm$^2$ to form an overcoat layer for blocking oxygen and for excluding the adverse influences of a standing wave.

Among the PS plates thus prepared, those of Examples I and II and Comparative Example I were exposed through a negative mask to a high pressure mercury lamp at three radiation doses (20, 100 and 200 mJ/cm$^2$), whereas the PS plates of Examples III and IV and Comparative Example II were imagewise scanned with an argon laser at three radiation doses (1, 2.5 and 12 mJ/cm$^2$) to draw a pattern. Following the exposure, the PS plates were developed with a 0.5% aqueous solution of sodium carbonate at 26° C. for three periods of time (60, 120 and 180 seconds) to produce a printing pattern. The resulting patterns were evaluated by the following criteria. Tables 3 and 4 show the results.

○: Liquid developer caused little loss in coating and unexposed areas contained no residue of the photosensitive resin composition.

Δ: Liquid developer caused some loss in coating and unexposed areas contained small residue of the photosensitive resin composition.

x: Liquid developer caused extensive loss in coating together with partial chipping and peeling and unexposed areas contained a definite residue of the photosensitive resin composition.

TABLE 3

| Photosensitive resin composition | Development time (sec.) | Conditions of printing pattern formation Irradiation energy (mJ/cm$^2$) | | |
|---|---|---|---|---|
| | | 20 | 100 | 200 |
| Ex. I | 60 | ○ | ○ | ○ |
| | 120 | ○ | ○ | ○ |
| | 180 | Δ | ○ | ○ |
| Ex. II | 60 | ○ | ○ | ○ |
| | 120 | ○ | ○ | ○ |
| | 180 | ○ | ○ | ○ |
| C. Ex. I | 60 | X | ○ | ○ |
| | 120 | X | Δ | ○ |
| | 180 | X | Δ | Δ |

TABLE 4

| Photosensitive resin composition | Development time (sec.) | Conditions of printing pattern formation Irradiation energy (mJ/cm$^2$) | | |
|---|---|---|---|---|
| | | 1 | 1.5 | 12 |
| Ex. III | 60 | ○ | ○ | ○ |
| | 120 | ○ | ○ | ○ |
| | 180 | Δ | Δ | ○ |
| Ex. IV | 60 | ○ | ○ | ○ |
| | 120 | ○ | ○ | ○ |
| | 180 | Δ | ○ | ○ |
| C. Ex. II | 60 | X | X | Δ |
| | 120 | X | X | Δ |
| | 180 | X | X | X |

As Tables 3 and 4 show, the photosensitive resin compositions of the second aspect of the present invention were highly sensitive and exhibited adequate sensitivity to low-energy argon laser light operating in the visible region. Furthermore, compared to the samples of Comparative Examples, the photosensitive resin compositions of the second aspect of the present invention showed markedly widened development margins.

As discussed above in detail, the photosensitive resin composition of the second aspect of the present invention has sufficiently high sensitivity and resolution to make it possible to produce high-quality color filters by the pigment dispersion method and the like. The photosensitive resin composition of the second aspect of the present invention also exhibits such high sensitivity to low-energy laser light operating in the visible region that it enables the production of highly sensitive PS plates, that can be used in platemaking with an argon ion laser light or the like. Furthermore, the photosensitive resin composition of the second aspect of the present invention has a wide enough development margin to assure very high operating stability in the development process.

While the invention has been described in detail and with reference to specific examples thereof, it will be apparent to one skilled in the art that various changes and modifications can be made therein without departing from the spirit and scope thereof.

What is claimed is:

1. A photosensitive resin composition comprising a polymeric binder, a monomer having an ethylenically unsaturated double bond and photopolymerization initiators, said resin composition containing an acridine compound and at least one triazine compound represented by the following formulae (VII), (VIII) and (IX) as said photopolymerization initiators:

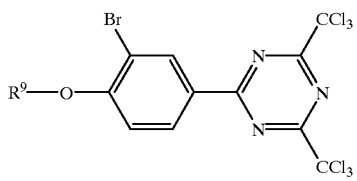

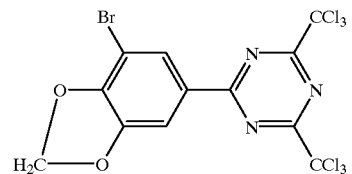

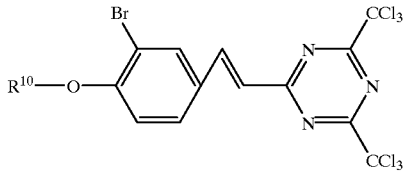

wherein $R^9$ and $R^{10}$ each independently represents an alkyl group having 1 to 3 carbon atoms.

2. The photosensitive resin composition as claimed in claim 1, wherein said acridine compound is at least one compound selected from the group consisting of 9-phenylacridine, 1,7-bis(9-acridinyl)heptane, 1,5-bis(9-acridinyl)pentane and 1,3-bis(9-acridinyl)propane.

3. The photosensitive resin composition as claimed in claim 2, wherein said acridine compound is 9-phenylacridine.

4. The photosensitive resin composition as claimed in claim 1, wherein said triazine compound is at least one compound selected from the group consisting of 2-(3'-bromo-4'-methoxyphenyl)-4,6-bis(trichloromethyl)-s-triazine, 2-(3'-bromo-4'-ethoxyphenyl)-4,6-bis(trichloromethyl)-s-triazine, 2-(3'-bromo-4',5'-methylenedioxyphenyl)-4,6-bis(trichloromethyl)-s-triazine, 2-(3'-bromo-4'-methoxystyryl)-4,6-bis(trichloromethyl)-s-triazine and 2-(3'-bromo-4'-ethoxystyryl)-4,6-bis(trichloromethyl)-s-triazine.

5. The photosensitive resin composition as claimed in claim 4, wherein said triazine compound is 2-(3'-bromo-4'-ethoxyphenyl)-4,6-bis(trichloromethyl)-s-triazine, 2-(3'-bromo-4',5'-methylenedioxyphenyl)-4,6-bis(trichloromethyl)-s-triazine or 2-(3'-bromo-4'-ethoxystyryl)-4,6-bis(trichloromethyl)-s-triazine.

6. The photosensitive resin composition as claimed in claim 1, wherein the compositional ratio by weight of said acridine compound to said triazine compound ranges from 1:80 to 8:1.

7. The photosensitive resin composition as claimed in claim 6, wherein the compositional ratio by weight of said acridine compound to said triazine compound ranges from 1:10 to 2:1.

8. The photosensitive resin composition as claimed in claim 1, wherein the content of said photopolymerization initiators ranges from 1 to 40 parts by weight per 100 parts by weight of the solids content in said photosensitive resin composition.

9. The photosensitive resin composition as claimed in claim 1, which contains 2-benzyl-2-dimethylamino-1-(4-morpholinophenyl)-butane-1-one as an additional photopolymerization initiator.

10. The photosensitive resin composition as claimed in claim 9, wherein the compositional ratio by weight between said 2-benzyl-2-dimethylamino-1-(4-morpholino-phenyl)-butane-1-one, said acridine compound and said triazine compound is 1:(0.05–2):(0.25–4).

11. The photosensitive resin composition as claimed in claim 10, wherein the compositional ratio by weight between said 2-benzyl-2-dimethylamino-1-(4-morpholino-phenyl)-butane-1-one, said acridine compound and said triazine compound is 1:(0.2–1):(0.5–2).

12. The photosensitive resin composition as claimed in claim 9, which contains 2-(o-chlorophenyl)-4,5-diphenylimidazolyl dimer as an additional photopolymerization initiator.

13. The photosensitive resin composition as claimed in claim 12, wherein the content of said 2-(o-chlorophenyl)-4,5-diphenylimidazolyl dimer ranges from 0.05 to 2 parts by weight per part by weight of said triazine compound.

14. The photosensitive resin composition as claimed in claim 1, which contains 2-(o-chlorophenyl)-4,5-diphenylimidazolyl dimer as an additional photopolymerization initiator.

15. The photosensitive resin composition as claimed in claim 14, wherein the content of said 2-(o-chlorophenyl)-4,5-diphenylimidazolyl dimer ranges from 0.05 to 2 parts by weight of said triazine compound.

16. The photosensitive resin composition as claimed in claim 1, which contains a titanocene compound as an additional photopolymerization initiator.

17. The photosensitive resin composition as claimed in claim 16, wherein said titanocene compound is represented by the following formula (XIV):

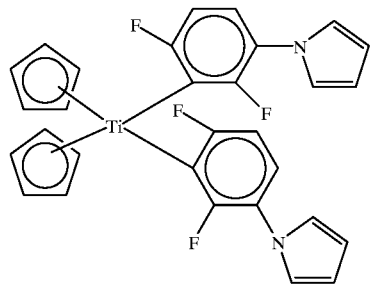

(XIV)

18. The photosensitive resin composition as claimed in claim 1, which further contains a pigment.

19. The photosensitive resin composition as claimed in claim 1, which further contains 3-methoxybutyl acetate or 3-methyl-3-methoxybutyl acetate as a solvent component.

20. The photosensitive resin composition as claimed in claim 1, wherein the ethylenically unsaturated monomer is a polyfunctional monomer having functional groups.

21. The photosensitive resin composition as claimed in claim 1, wherein the triazine compound is used in a total amount of from 0.1 to 15 parts by weight based on 100 parts of the total solids content of the photosensitive resin composition.

22. The photosensitive resin composition as claimed in claim 1, wherein at least one additive selected from the group consisting of fine metal particles, fine metal oxide particles and fine plastic particles is added to the photosensitive resin composition in an amount of from 1 to 40 parts by weight per 100 parts by weight of the total solids content of the photosensitive resin composition.

23. The photosensitive resin composition as claimed in claim 1, wherein the polymeric binder is used in an amount of from 10 to 60 parts by weight, the ethylenically unsaturated monomer is used in an amount of from 20 to 70 parts by weight, and the photopolymerization initiator is used in an amount of from 0.1 to 30 parts by weight each based on 100 parts by weight of the total solids content of the photosensitive resin composition.

24. The photosensitive resin composition as claimed in claim 1, wherein alkylene glycol monoalkyl ether, alkylene glycol dialkyl ether, ketone, alcohol, or carboxylic acid ester is added as a solvent to the photosensitive resin composition.

* * * * *